United States Patent
Hatano et al.

(10) Patent No.: US 11,946,879 B2
(45) Date of Patent: Apr. 2, 2024

(54) INTEGRATED CIRCUIT AND SENSOR SYSTEM

(71) Applicant: TOKYO INSTITUTE OF TECHNOLOGY, Tokyo (JP)

(72) Inventors: Mutsuko Hatano, Tokyo (JP); Takayuki Iwasaki, Tokyo (JP); Nobuhiko Nishiyama, Tokyo (JP); Yuta Masuyama, Tokyo (JP); Takuya Murooka, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 519 days.

(21) Appl. No.: 17/275,935

(22) PCT Filed: Sep. 13, 2019

(86) PCT No.: PCT/JP2019/036193
§ 371 (c)(1),
(2) Date: Mar. 12, 2021

(87) PCT Pub. No.: WO2020/054860
PCT Pub. Date: Mar. 19, 2020

(65) Prior Publication Data
US 2022/0057338 A1 Feb. 24, 2022

(30) Foreign Application Priority Data
Sep. 14, 2018 (JP) .................................. 2018-172948

(51) Int. Cl.
*G01N 22/00* (2006.01)
*H01L 27/144* (2006.01)
(Continued)

(52) U.S. Cl.
CPC ......... *G01N 22/00* (2013.01); *H01L 27/1446* (2013.01); *H01L 31/028* (2013.01); *H01L 31/105* (2013.01)

(58) Field of Classification Search
CPC .............. H01L 27/1225; H01L 27/1251; H01L 27/0629
See application file for complete search history.

(56) References Cited

U.S. PATENT DOCUMENTS 5,243,199 A * 9/1993 Shiomi ............... H01L 29/1602
257/478
2003/0131787 A1 * 7/2003 Linares ................... C30B 25/02
117/93

(Continued)

FOREIGN PATENT DOCUMENTS

JP 2016-114563 A 6/2016
JP 2016-205954 A 12/2016
(Continued)

OTHER PUBLICATIONS

The Partial Supplementary European search report issued by the European Patent Office for coresponding European Patent Application No. 19860575.0-1212, dated Apr. 22, 2022.

(Continued)

*Primary Examiner* — Jermele M Hollington
*Assistant Examiner* — Temilade S Rhodes-Vivour
(74) *Attorney, Agent, or Firm* — Myers Wolin, LLC

(57) ABSTRACT

A thin film has a band gap of 2.2 eV or more and in which a crystal includes an atomic vacancy and an electron, a microwave irradiation system configured to irradiate the thin film with a microwave in response to driving from outside, an excitation unit configured to excite the electron included in the thin film in response to driving from outside, and a detector configured to detect, as an electric signal, at least either one of an intensity of light outputted from the thin film (Continued)

when the electron transitions from an excited state to a ground state and a change in conductivity of the thin film based on excitation.

36 Claims, 15 Drawing Sheets

(51) Int. Cl.
*H01L 31/028* (2006.01)
*H01L 31/105* (2006.01)

(56) References Cited

U.S. PATENT DOCUMENTS

| | | | |
|---|---|---|---|
| 2011/0176357 A1* | 7/2011 | Koyama | H01L 27/1251 365/149 |
| 2014/0247048 A1 | 9/2014 | Cochrane et al. | |
| 2015/0084044 A1* | 3/2015 | Tanaka | H01L 29/4908 257/43 |
| 2016/0174867 A1 | 6/2016 | Hatano et al. | |
| 2016/0313408 A1 | 10/2016 | Hatano et al. | |
| 2017/0328965 A1 | 11/2017 | Hruby et al. | |
| 2018/0202952 A1 | 7/2018 | Lutz et al. | |
| 2019/0154766 A1 | 5/2019 | Lutz et al. | |
| 2019/0235031 A1 | 8/2019 | Ibrahim et al. | |

FOREIGN PATENT DOCUMENTS

| | | |
|---|---|---|
| JP | 2017-162910 A | 9/2017 |
| WO | 2016/177490 A1 | 11/2016 |

OTHER PUBLICATIONS

Hatano et al., "Diamond Electronics", 46th European Solid-State Device Research Conference, IEEE, Sep. 2016, XP032980760, pp. 330-332.

International Search Report and Written Opinion of the International Searching Authority issued by the Japan Patent Office for corresponding International Patent Application No. PCT/JP2019/036193, dated Nov. 26, 2019, with partial English translation.

Extended European search report with supplementary European search report and the European search opinion issued by the European Patent Office for corresponding European Patent Application No. 19860575.0-1212, dated Jul. 25, 2022.

* cited by examiner

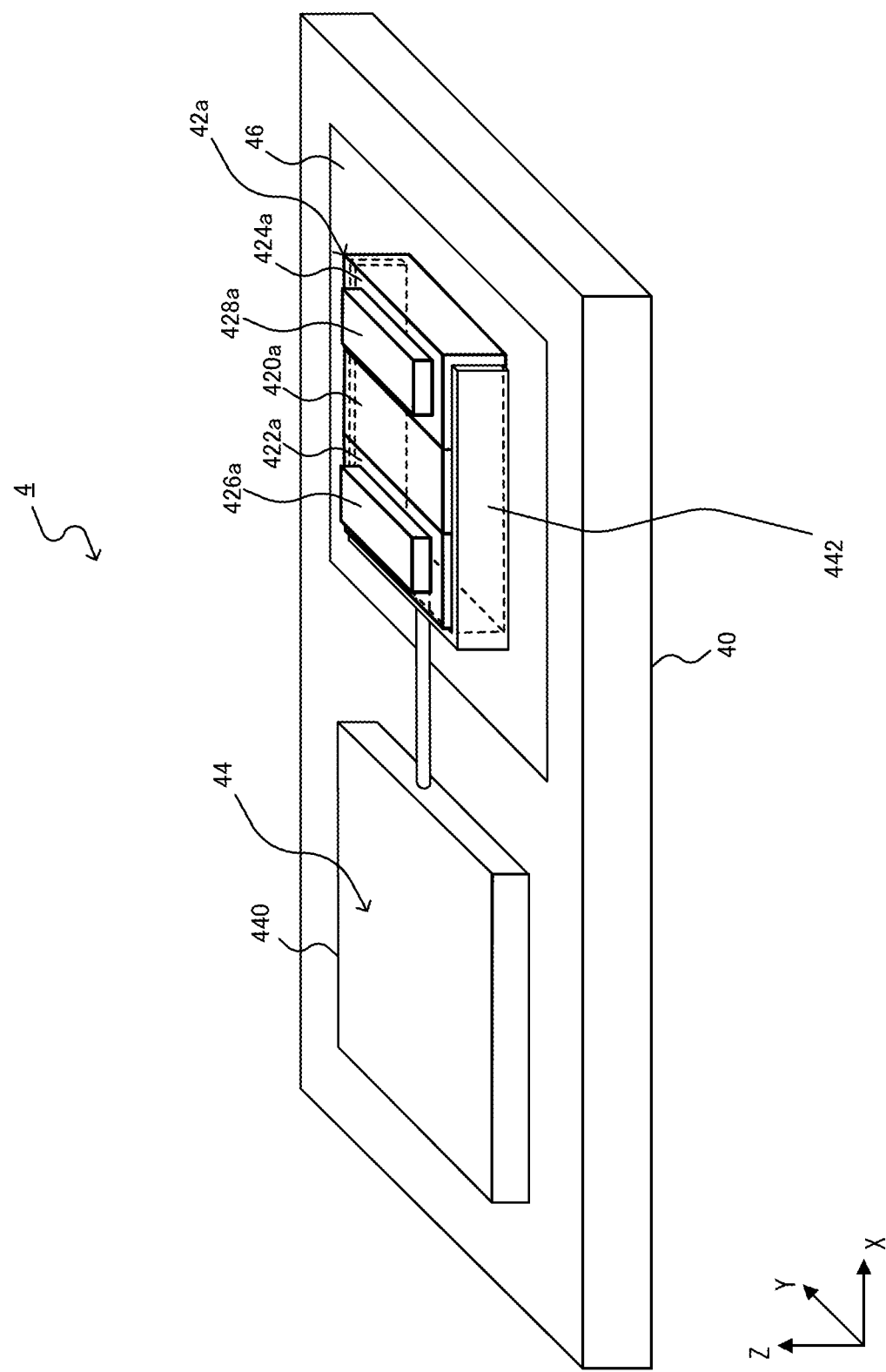

INTEGRATED CIRCUIT AND SENSOR SYSTEM

CROSS-REFERENCE TO RELATED APPLICATION

This application is a national stage application of International Application No. PCT/JP2019/036193, filed on Sep. 13, 2019 and designated the U.S., which claims priority to Japanese Patent Application No. 2018-172948, filed on Sep. 14, 2018. The contents of each are herein incorporated by reference.

FIELD

The present disclosure relates to an integrated circuit and a sensor system.

BACKGROUND

A technique has been proposed for measuring parameters such as a magnetic field, an electric field, and a temperature inside of a semiconductor device by using optically detected magnetic resonance (ODMR) with an NV (Nitrogen-Vacancy) center of diamond (for example, PTL 1).

CITATION LIST

Patent Literature

[PTL 1] JP 2017-162910 A

SUMMARY

Technical Problem

In order to enhance sensitivity to a magnetic field or the like measured by using an NV center of diamond, it is necessary to improve the generation rate of the NV center generated in diamond, for example. Conventionally, the generation rate of the NV center is on the order of from 0.4% to less than 1% (for example, see Ozawa et al., "Formation of perfectly aligned nitrogen-vacancy-center ensembles in chemical-vapor-deposition-grown diamond", Applied Physics Express 10, 045501, 2017, and the like).

In addition, it is considered that a sensor system that has successfully achieved higher detection sensitivity to a magnetic field or the like can have a wider application range to a living body, a device, or the like when the size thereof is reduced. However, conventionally, there has been a problem that it is difficult to reduce the size of a sensor system that utilizes a quantum state such as a diamond NV center.

The present disclosure has been made in view of the above, and an object of the present disclosure is to provide an integrated circuit and a sensor system that can be reduced in size while having higher detection sensitivity to a magnetic field or the like.

Solution to Problem

In order to solve the above-described problem and achieve the object, an integrated circuit according to an aspect of the present disclosure includes a thin film that has a band gap of 2.2 eV or more and in which a crystal includes an atomic vacancy and an electron, a microwave irradiation system that irradiates the thin film with a microwave in response to driving from outside, an excitation unit that excites the electron included in the thin film in response to driving from outside, and a detection unit that detects, as an electric signal, at least either one of an intensity of light outputted from the thin film when the electron transitions from an excited state to a ground state and a change in conductivity of the thin film based on excitation.

In addition, an integrated circuit according to an aspect of the present disclosure includes a diamond film provided with a region including a complex (an NV center) of nitrogen (N) that has replaced a carbon atom and a vacancy (V) adjacent to the nitrogen, a microwave irradiation system that irradiates a thin film formed of the diamond film with a microwave in response to driving from outside, an excitation unit that excites an electron included in the thin film in response to driving from outside, and a detection unit that detects, as an electric signal, at least either one of an intensity of light outputted from the thin film when the electron transitions from an excited state to a ground state and a change in conductivity of the diamond film based on excitation.

In addition, in the integrated circuit according to an aspect of the present disclosure, the detection unit is a photoelectric conversion element that converts the light outputted from the thin film into an electric signal.

In addition, in the integrated circuit according to an aspect of the present disclosure, the detection unit is an electric circuit that detects the change in conductivity of the thin film as an electric signal.

In addition, in the integrated circuit according to an aspect of the present disclosure, the detection unit includes a P-type semiconductor and an N-type semiconductor provided so as to sandwich the thin film to detect the electron.

In addition, in the integrated circuit according to an aspect of the present disclosure, the excitation unit includes a P-type semiconductor and an N-type semiconductor provided so as to sandwich the thin film to bring the electron into the excited state.

In addition, in the integrated circuit according to an aspect of the present disclosure, the thin film, the P-type semiconductor, and the N-type semiconductor constitute a PIN diode.

In addition, in the integrated circuit according to an aspect of the present disclosure, the excitation unit irradiates the thin film with an excitation light made incident from outside through a waveguide having a core layer that transmits light by being sandwiched between clad layers that transmit light.

In addition, in the integrated circuit according to an aspect of the present the clad layer is formed such that a thickness of a region sandwiched between the core layer and the thin film becomes gradually thinner as the excitation light made incident from outside advances in a light guide direction.

In addition, in the integrated circuit according to an aspect of the present disclosure, the core layer has a diffraction grating formed therein so as to diffract the excitation light toward the thin film.

In addition, in the integrated circuit according to an aspect of the present disclosure, the diffraction grating is formed such that a period thereof becomes shorter as the excitation light made incident from outside advances in a light guide direction.

In addition, in the integrated circuit according to an aspect of the present disclosure, the thin film is diamond including an NV center, or silicon carbide (SiC), gallium nitride (GaN), zinc oxide (ZnO), aluminum nitride (AlN), boron nitride (BN), or gallium oxide ($Ga_2O_3$) that has an atomic vacancy in a crystal thereof.

In addition, in the integrated circuit according to an aspect of the present disclosure, the thin film is formed by chemical vapor deposition using a gas mixture containing approximately 10% to 15% of a noble gas.

In addition, in the integrated circuit according to an aspect of the present disclosure, the noble gas is argon gas.

In addition, a sensor system according to an aspect of the present disclosure includes an integrated circuit including a thin film that has a band gap of 2.2 eV or more and in which a crystal includes an atomic vacancy and an electron, a microwave generation unit that generates a microwave to irradiate the thin film, an excitation driving unit that drives to excite the electron included in the thin film, and a detection circuit that detects, as an electric signal, at least either one of an intensity of light outputted from the thin film when the electron transitions from an excited state to a ground state and a change in conductivity of the thin film based on excitation, in which the integrated circuit includes at least any one of a microwave irradiation system that irradiates the thin film with the microwave in response to driving from outside, an excitation unit that excites the electron included in the thin film in response to driving from outside, a photoelectric conversion element that detects the intensity of light outputted from the thin film as an electric signal when the electron transitions from an excited state to a ground state, and an electric circuit that detects the change in conductivity of the thin film based on excitation as an electric signal.

In addition, a sensor system according to an aspect of the present disclosure includes an integrated circuit having a diamond film provided with a region including a complex (an NV center) of nitrogen (N) that has replaced a carbon atom and a vacancy (V) adjacent to the nitrogen, a microwave generation unit that generates a microwave to irradiate the diamond film, an excitation driving unit that drives to excite an electron included in the diamond film, and a detection circuit that detects, as an electric signal, at least either one of an intensity of light outputted from the diamond film when the electron transitions from an excited state to a ground state and a change in conductivity of the diamond film based on excitation, in which the integrated circuit includes at least any one of a microwave irradiation system that irradiates the diamond film with the microwave in response to driving from outside, an excitation unit that excites the electron included in the diamond film in response to driving from outside, and a photoelectric conversion element that detects, as an electric signal, the intensity of light outputted from the diamond film when the electron transitions from an excited state to a ground state, and an electric circuit that detects the change in conductivity of the diamond film based on excitation as an electric signal.

In addition, the sensor system according to an aspect of the present disclosure, includes a plurality of the integrated circuits, in which the plurality of the integrated circuits can be arranged in an array on a surface of a measurement target.

BRIEF DESCRIPTION OF DRAWINGS

FIG. 3 is a diagram schematically illustrating a configuration example of the integrated circuit according to one embodiment.

FIG. 16 is a graph illustrating characteristics of photoelectric detection of magnetic resonance characteristics of the modification of the diamond semiconductor or the like.

DESCRIPTION OF EMBODIMENTS

Hereinafter, an embodiment of a sensor system 1 will be described in detail with reference to the drawings.

Figure 1:
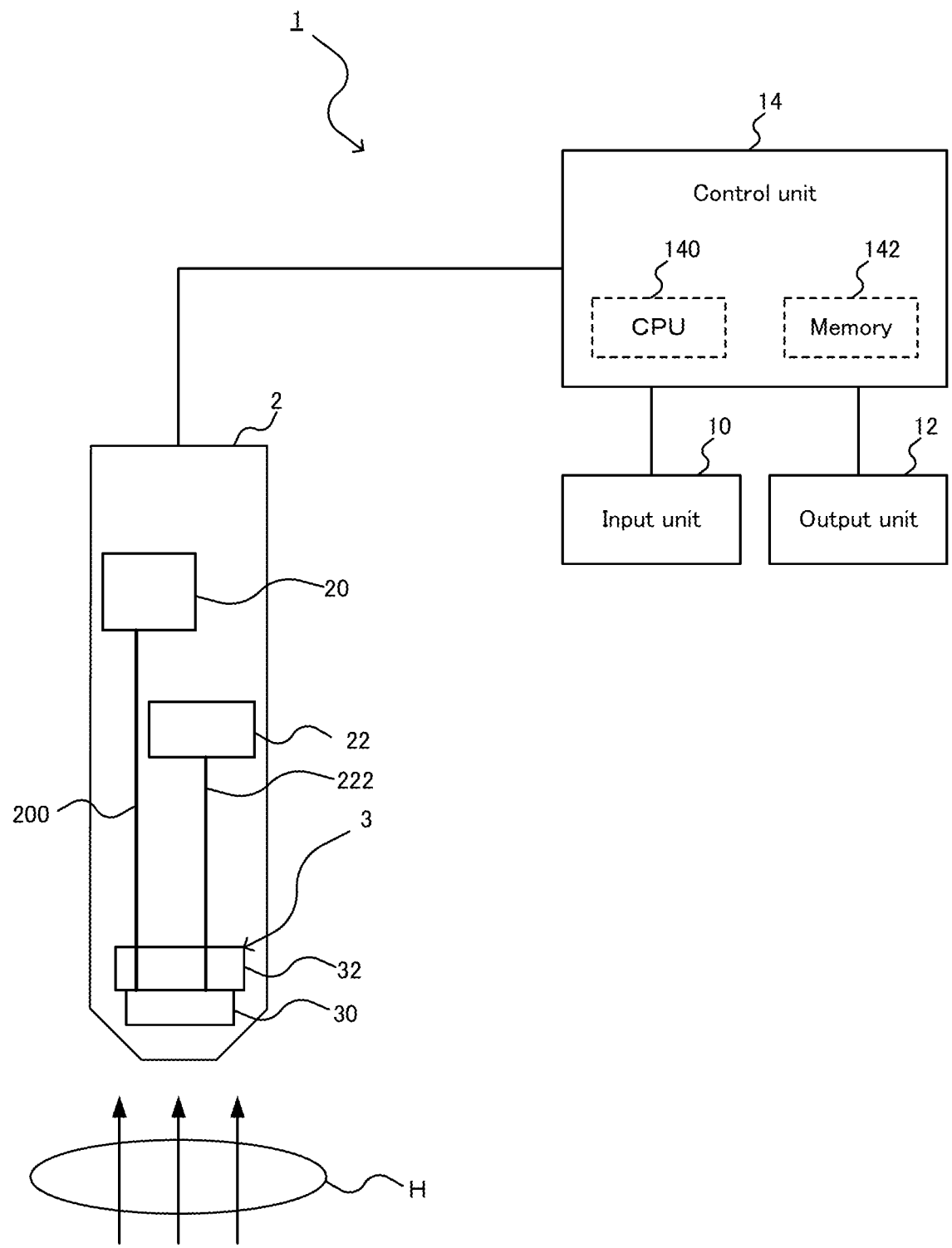
FIG. 1 is a diagram schematically illustrating a configuration example of the sensor system according to one embodiment.

FIG. 1 is a diagram schematically illustrating a configuration example of the sensor system 1 according to one embodiment. As shown in FIG. 1, the sensor system 1 includes a probe 2, an input unit 10, an output unit 12, and a control unit 14. Then, the sensor system 1 is a solid-state quantum sensor system that can measure a magnetic field, an electric field, a temperature, and the like of a target H and the like with high sensitivity by using the probe 2.

Specifically, the input unit 10 is an input device that receives an operation input of a user to the sensor system 1. The output unit 12 is an output device that outputs a result of measurement made by the sensor system 1 by way of display or the like. The control unit 14 includes a CPU 140 and a memory 142, and performs driving and control of the respective units that configure the sensor system 1.

In addition, the probe 2 is provided with, for example, an integrated circuit 3, a light source 20, and a detector 22 therein. The integrated circuit 3 includes, for example, a diamond semiconductor 30 and a microwave irradiation system 32.

The diamond semiconductor 30 is a so-called diamond sensor that includes, for example, an NV center (nitrogen-vacancy center). The NV center is a composite defect in which carbon in a diamond crystal is replaced by nitrogen and a vacancy exists at an adjacent position thereof. When the NV center captures one electron, magnetic properties of electron spin is displayed.

The microwave irradiation system 32 is formed on, for example, a silicon substrate, and irradiates the diamond semiconductor 30 with a microwave having a frequency corresponding to driving and control by the control unit 14.

In addition, the integrated circuit 3 may be configured as a hybrid integrated circuit in which the diamond semiconductor 30 and the microwave irradiation system 32 are separately formed, or may be integrally formed with the diamond semiconductor 30 and the microwave irradiation system 32 as a monolithic integrated circuit.

The light source 20 is, for example, a laser light source or an LED (Light Emitting Diode). The light source 20 irradiates the diamond semiconductor 30 with a green light as an excitation light via, for example, an optical fiber 200 or the like. When the diamond semiconductor 30 is irradiated with the green light, the region that includes the NV center emits a red light.

The detector 22 is a photoelectric conversion element such as a PD (photodiode) or an APD (avalanche photodiode). The detector 22 may be an imaging sensor such as a CCD (Charge Coupled Device) or a CMOS (Complementary Metal Oxide Semiconductor) sensor. In addition, the detector 22 receives a red light emitted by the diamond semiconductor 30 via, for example, an optical fiber 222, and outputs, to the control unit 14, an electric signal corresponding to the intensity of the received red light. Furthermore, the detector 22 may constitute a detection circuit that detects a change in light, electricity, or the like.

Then, the microwave irradiation system 32 constitutes a microwave generation unit such that the frequency of the microwave, with which the region including the NV center of the diamond semiconductor 30 is irradiated, can be swept by driving and control of the control unit 14. In addition, the microwave emitted by the microwave irradiation system 32 is, for example, a continuous wave that is temporally continuous. The microwave irradiation system 32 may have a higher performance so as to emit a pulse-like microwave a plurality of times at a predetermined time interval. In addition, the light source 20 constitutes an excitation driving unit that excites an unpaired electron included in the region including the NV center of the diamond semiconductor 30 by driving and control of the control unit 14.

That is, the sensor system 1 measures a magnetic field or the like by irradiating the diamond semiconductor 30 simultaneously with the microwave and the green light, and detecting, with the detector 22, the intensity changes of the fluorescent light (red light) of the diamond semiconductor 30 that changes in accordance with the frequency of the microwave to be magnetically resonated.

Next, modifications of the probe 2 will be described.

Figure 2A:
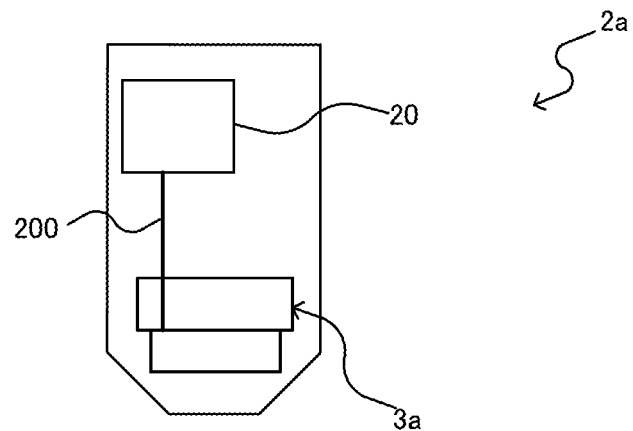
FIG. 2A is a diagram illustrating a first modification of a probe.
Figure 2:
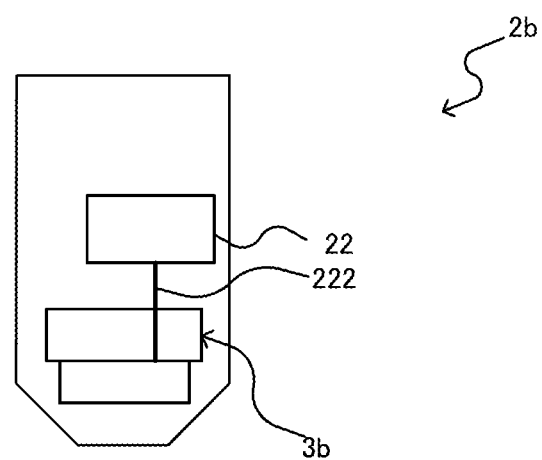
FIG. 2B is a diagram illustrating a second modification of a probe.
FIG. 2C is a diagram illustrating a third modification of a probe.
Figure 2C:
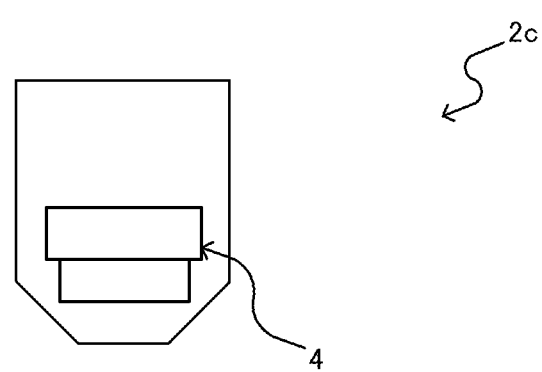

FIG. 2 shows diagrams for schematically illustrating the modifications of the probe 2. FIG. 2A shows a first modification (probe 2a) of the probe 2, FIG. 2B shows a second modification (probe 2b) of the probe 2, and FIG. 2C shows a third modification (probe 2c) of the probe 2. Hereinafter, the substantially same components as those of the sensor system 1 shown in FIG. 1 are denoted by the same reference numerals.

As shown in FIG. 2A, the probe 2a includes, for example, an integrated circuit 3a and a light source 20. With respect to the integrated circuit 3, for example, the integrated circuit 3a has a configuration in which a photoelectric conversion element that receives a red light emitted by the diamond semiconductor 30 is further mounted (see FIG. 1). Therefore, the probe 2a has a function equivalent to that of the probe 2 shown in FIG. 1, and is smaller than the probe 2.

As shown in FIG. 2B, the probe 2b includes, for example, an integrated circuit 3b and a detector 22. The integrated circuit 3b further includes a configuration in which an electron is excited in a region including the NV center of the diamond semiconductor 30 (see FIG. 4 and the like). Therefore, the probe 2b has a function equivalent to that of the probe 2 shown in FIG. 1, and is smaller than the probe 2.

As shown in FIG. 2C, the probe 2c has, for example, an integrated circuit 4. With respect to the integrated circuit 3, for example, the integrated circuit 4 includes a configuration in which an electron is excited in a region including the NV center of the diamond semiconductor 30 and a photoelectric conversion element that receives a red light emitted by the diamond semiconductor 30. In addition, the integrated circuit 4 may include an electric circuit that detects, as an electric signal, a conductivity at a predetermined position in the integrated circuit 4 when the electron transitions from the excited state to the ground state in a region including the NV center of the diamond semiconductor 30. Therefore, the probe 2c has a function equivalent to that of the probe 2 shown in FIG. 1, and is smaller than the probes 2a and 2b.

Next, a configuration example of the integrated circuit 4 shown in FIG. 2C will be described more specifically.

Figure 4A:
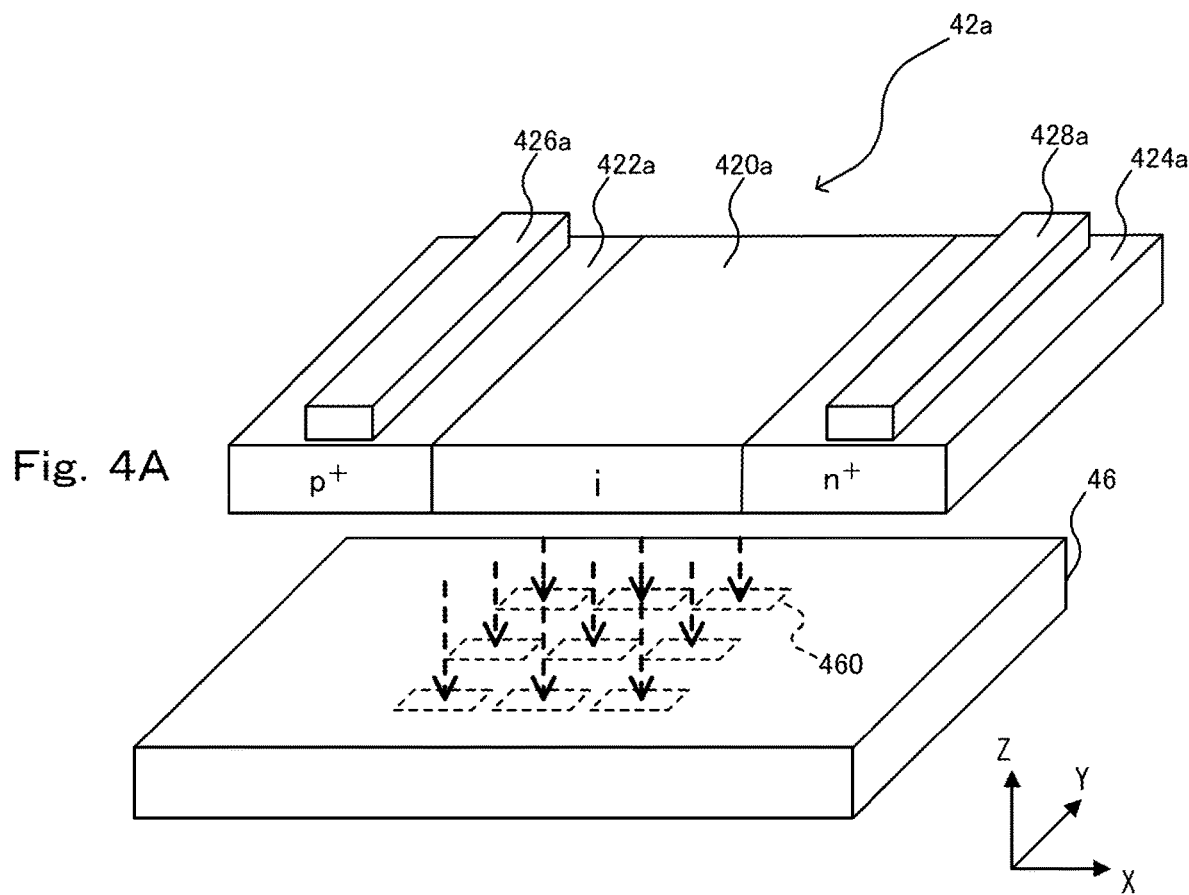
FIG. 4A is a perspective view schematically illustrating a diamond semiconductor and a detection unit.
Figure 4B:
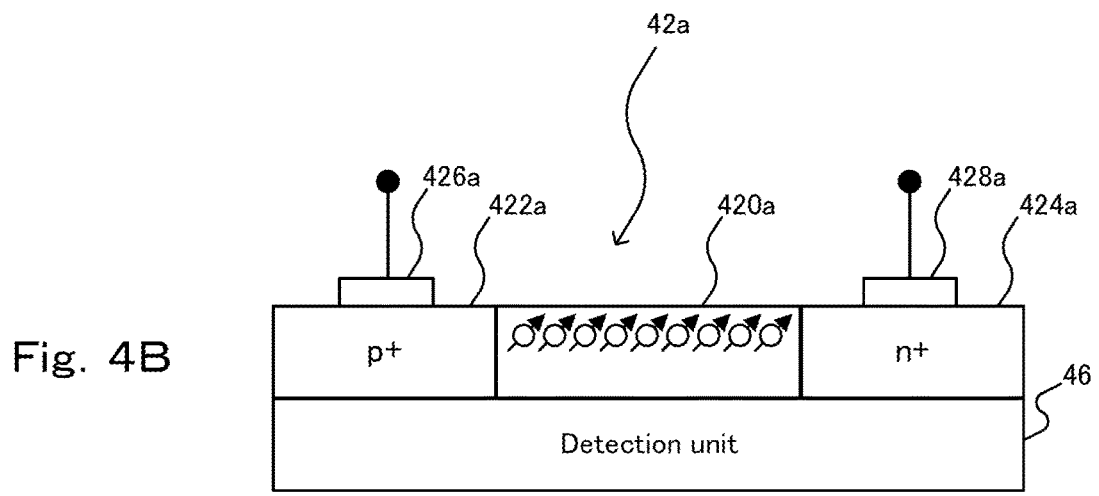
FIG. 4B is a diagram schematically illustrating a cross section of the diamond semiconductor and the detection unit.

FIG. 3 is a diagram schematically illustrating a configuration example of the integrated circuit 4 according to one embodiment. As shown in FIG. 3, the integrated circuit 4 is, for example, a monolithic integrated circuit in which a diamond semiconductor 42a, a microwave irradiation system 44, and a detection unit 46 are stacked on a silicon substrate 40. Such a structure can be formed by laminating and mounting each layer, or by heteroepitaxially growing a diamond film on the silicon substrate. In addition, FIG. 4 shows diagrams for illustrating the relationship between the diamond semiconductor 42a and the detection unit 46 that are formed on the integrated circuit 4. FIG. 4A is a perspective view schematically illustrating the diamond semiconductor 42a and the detection unit 46, and FIG. 4B is a diagram schematically illustrating a cross section of the diamond semiconductor 42a and the detection unit 46.

The diamond semiconductor 42a is an intrinsic semiconductor (i-type semiconductor), and includes a thin film 420a including an NV center, as well as a P-type semiconductor 422a and an N-type semiconductor 424a arranged in such a manner as to sandwich the thin film 420a. The thin film 420a may be configured to be a diamond film having a low N-type or P-type impurity concentration to include an NV center. The P-type semiconductor 422a is a semiconductor in which diamond is doped with an impurity such as boron, and is provided with a metal electrode 426a. The N-type semiconductor 424a is a semiconductor in which diamond is doped with an impurity such as phosphorus, and is provided with a metal electrode 428a. That is, the diamond semiconductor 42a is a PIN (p-intrinsic-n) diode formed of diamond.

The P-type and N-type impurity concentrations are desirably set such that the number concentration is within a range of $10^{16}$ cm$^{-3}$ to $10^{20}$ cm$^{-3}$. In addition, the number concentration of the i-layer is set to $10^{17}$ cm$^{-3}$ or less, and more preferably, the number concentration thereof is set to $10^{15}$ cm$^{-3}$ or less.

The electrodes 426a and 428a apply a voltage supplied from an external power supply (not shown) to the diamond semiconductor 42a according to control of the control unit 14 (FIG. 1). As described above, the diamond semiconductor 42a is a PIN diode, and a voltage is applied in forward and reverse directions according to control of the control unit 14. Electrons inside the diamond semiconductor 42a are excited by applying a voltage in the forward direction. Furthermore, electron spin can be initialized by using the PIN diode. In addition, an internal charge (electron) in the diamond semiconductor 42a can be detected by applying a voltage in the reverse direction.

It should be noted that the thin film 420a is diamond including an NV center formed by chemical vapor deposition (CVD) using a gas including methane, hydrogen, and nitrogen. Here, when a gas in which a noble gas such as argon is mixed at a predetermined concentration is used, such an effect is yielded that the generation rate of the NV center is improved. Note that the noble gas is not limited to argon, but may be xenon, krypton, helium, or the like.

The microwave irradiation system 44 includes a microwave generation circuit 440 and an antenna 442. The microwave generation circuit 440 generates a microwave having a predetermined frequency by driving and control of the control unit 14. The antenna 442 is a U-shaped resonator antenna provided with two plate-shaped portions extending in the X direction and facing each other, and irradiates the diamond semiconductor 42a with the microwave generated by the microwave generation circuit 440. The antenna 442 may be formed in another shape to irradiate the diamond semiconductor 42a with the microwave. Then, the microwave irradiation system 44 brings the unpaired electron included in the thin film 420a into an electron spin resonance (ESR) state according to control of the control unit 14.

In the detection unit 46, for example, a photoelectric conversion element such as a PD (photodiode), an APD (avalanche photodiode), a CMOS sensor, or a CCD image sensor is formed on the silicon substrate 40, on which the diamond semiconductor 42a is stacked. The detection unit 46 may have the APD (avalanche photodiode) or the like arranged two-dimensionally. Specifically, the detection unit 46 has, for example, a plurality of light receiving units 460 arranged two-dimensionally. Each of the light receiving units 460 receives a fluorescent light emitted by the thin film 420a at each position on the XY plane, and outputs the intensity of the fluorescent light at each position to the control unit 14.

In the integrated circuit 4, when a voltage is applied to the diamond semiconductor 42a in the forward direction, an electron having energy equivalent to that of the unpaired electron included in the thin film 420a and excited by the green light is injected into the thin film 420a. That is, the electron is electrically excited in the thin film 420a. Then, the detection unit 46 detects a red light emitted by the thin film 420a when the electron in the excited state in the thin film 420a transitions to the ground state. As described above, in the integrated circuit 4, the electron is electrically excited in the thin film 420a, and the detection unit 46 optically detects the change in the intensity of the red light.

It should be noted that the integrated circuit 4 may be configured to be able to detect the conductivity of the thin film 420a or the change of the current of the PIN diode in the diamond semiconductor 42a constituting the PIN diode. That is, the diamond semiconductor 42a may also have a function as an electric circuit that is a part of the detection unit for detecting the conductivity of the diamond film or the change of the current of the PIN diode as an electric signal indicating a conductivity that changes in accordance with a change in the frequency of the microwave, so as to output the electric signal to the control unit 14. In addition, in the integrated circuit 4, the diamond semiconductor 42a may have both of a function as the excitation unit and a function as the detection unit so as to electrically excite an electron in the thin film 420a, and electrically detect a change when the electron transitions from the excited state to the ground state. In this case, in the diamond semiconductor 42a constituting the PIN diode, the electron spin is excited when a voltage is applied in the forward direction, and detection performance is improved when a voltage is applied in the reverse direction.

In addition, the detection unit 46 may be configured as an electric circuit that detects a change in conductivity of the thin film 420a as an electric signal indicating a conductivity that changes in accordance with a change in the frequency of the microwave, so as to output the electric signal to the control unit 14. In this case, in the integrated circuit 4, the electron is electrically excited in the thin film 420a, and the detection unit 46 electrically detects the change.

Next, a method of manufacturing the NV center included in the thin film 420a and the thin film 420a will be described in detail.

Figure 5A:
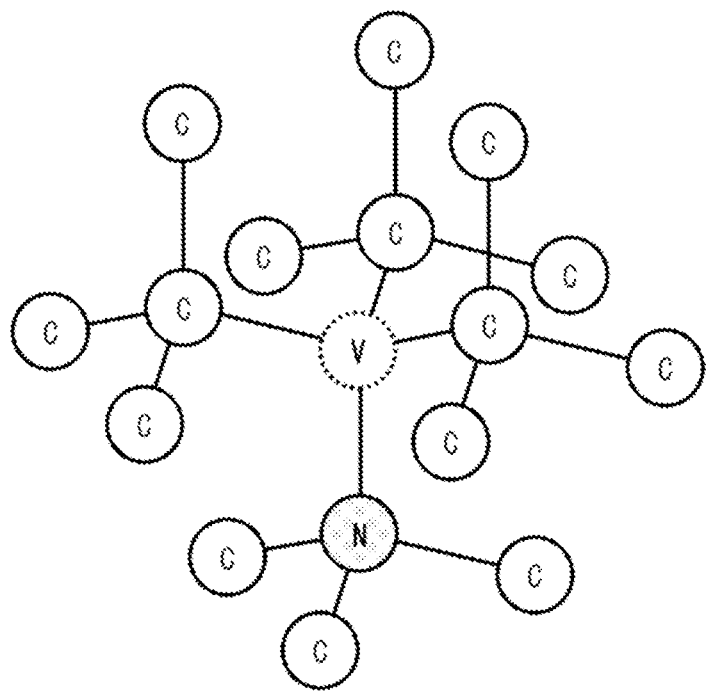
FIG. 5A is a diagram illustrating a crystal lattice of diamond having an NV center.
Figure 5B:
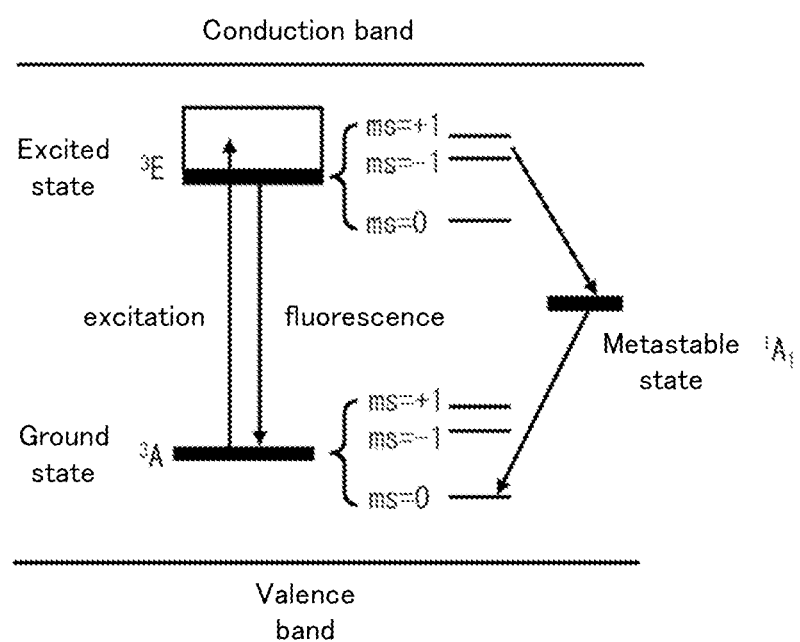
FIG. 5B is a diagram illustrating energy levels of the NV center.

FIG. 5 shows diagrams for illustrating an example of the NV center of diamond included in the thin film 420a shown in FIGS. 3 and 4. FIG. 5A shows a crystal lattice of diamond having the NV center, and FIG. 5B shows energy levels that the NV center possesses.

As shown in FIG. 5A, in the NV center, a fraction of carbon C in the diamond crystal lattice is replaced by nitrogen N shown by hatching. In addition, a position of one carbon C adjacent to the substituting nitrogen N is a vacancy V indicated by a dotted line. That is, the NV center is a composite defect in which the nitrogen N and the vacancy V adjacent to each other exist as a pair. "NV$^-$" that has captured one electron has a spin quantum number S=1 and forms a spin triplet state with a magnetic quantum number $m_s=-1, 0, +1$.

As shown in FIG. 5B, the electron spin of the NV center has energy levels of a spin triplet $^3A$ in the ground state, a spin triplet $^3E$ in the excited state, and a spin singlet $^1A_1$ in a metastable state between the spin triplet $^3A$ and the spin triplet $^3E$. Then, if an electric field or a magnetic field is not applied from outside, the NV center emits a fluorescent light (a red light) having a wavelength of about 630 nm to 800 nm when the electron spin returns from the excited state to the ground state after the electron spin is excited by an excitation light having a wavelength of about 495 nm to 570 nm (a green light).

The spin triplet $^3A$ in the ground state and the spin triplet $^3E$ in the excited state have spin sublevels ms that have been split into 0 and ±1. When a microwave having a frequency equal to the energy level difference of the spin triplet $^3A$ in the ground state is radiated to the NV center from outside, the state becomes an ESR state. In this case, a fraction of electrons having a spin sublevel ms of ±1 transition to the ground state via a metastable state without radiation even if excited to the excited state. For this reason, the intensity of the fluorescent light of the NV center decreases. In other words, the energy level difference when the spin sublevels ms are 0 and ±1 can be measured by obtaining a distribution of the intensities of the fluorescent light and the frequencies of the microwave, that is, a spectrum signal of the ODMR. Here, since ms=±1 undergoes Zeeman splitting in proportion to the intensity of the external magnetic field, the external magnetic field can be detected from the frequency at a point where the luminance of the red light decreases.

It should be noted that if an electric field or a magnetic field is not applied to the NV center from outside, the energy level difference when the spin sublevels ms are 0 and ±1 corresponds to a frequency of 2.87 GHz. Therefore, in order to bring the NV center of the thin film 420a into the ESR state, the center frequency of the microwave emitted by the microwave irradiation system 44 (FIG. 3) is set to 2.87 GHz.

In addition, in the solid-state quantum sensor, silicon carbide (SiC), gallium nitride (GaN), zinc oxide (ZnO), aluminum nitride (AlN), gallium oxide ($Ga_2O_3$), boron nitride (BN), and the like may be used in place of diamond. Note that the band gap of silicon carbide (SiC) is 2.20 eV to 3.02 eV, and the band gap of diamond is 5.74 eV, and these are considered wide band semiconductors.

When silicon carbide is used for the solid-state quantum sensor, a defect lattice in which silicon is eliminated and a vacancy is formed may be used as the thin film 420a as in the NV center of diamond. For example, by performing electron beam irradiation or ion implantation to silicon carbide, an atom of silicon Si is repelled to generate a defect lattice with a silicon vacancy. That is, in the solid-state quantum sensor, instead of the NV center of diamond, another complex such as SiV, SnV, PbV, or GeV may be used.

It should be noted that the measurement sensitivity of the magnetic field of the thin film 420a is expressed as in the expression (1).

[Math. 1]

$$\eta \propto \frac{1}{C_1\sqrt{N_1 T_2 V}} (T/\sqrt{Hz}) \quad (1)$$

η represents the measurement sensitivity of the magnetic field, $C_1$ represents a contrast, and $N_1$ represents a density of the NV center. In addition, V represents a volume, and $T_2$ represents a spin coherence time. As shown in Expression (1), in order to improve the measurement sensitivity of the magnetic field of the integrated circuit 4, it is required to increase the density of the NV center generated in the thin film 420a. However, conventionally, the generation rate of NV center is on the order of from 0.4% to less than 1%. Then, the inventors used a gas mixture to which a noble gas such as argon had been added together with conventional methane, nitrogen, and carbon in order to improve the generation rate of the NV center, which promotes decomposition of methane and leads to an increase in the number of radical ions such as carbon and nitrogen in the gas, to find that the generation rate of the NV center increases.

Figure 6:
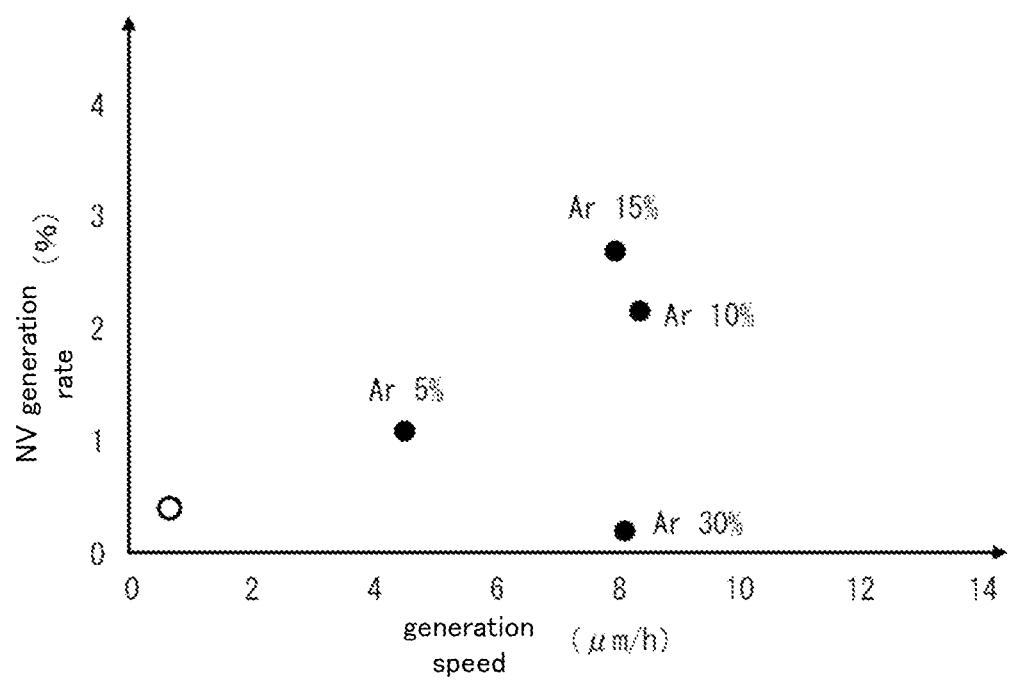
FIG. 6 is a graph illustrating the relationship between the growth speed and the generation rate of the NV centers of diamond according to the ratio of argon.

FIG. 6 is a graph illustrating the relationship between the growth speed and the generation rate of the NV center of diamond according to the ratio of argon. The vertical axis in FIG. 6 represents the NV generation rate, and the horizontal axis represents the NV generation speed. In addition, the black dots represent the NV generation rate and the NV generation speed when the argon ratio is 5%, 10%, 15%, and 30%, respectively. The white dot represents, as a conventional example, the NV generation rate and the NV generation speed in Ozawa et al., "Formation of perfectly aligned nitrogen-vacancy-center ensembles in chemical-vapor-deposition-grown diamond", Applied Physics Express 10, 045501, 2017. That is, the conventional NV generation rate is 0.4%, and the NV generation speed is 0.5 μm/h. Note that the NV generation rate and the NV generation speed shown in FIG. 6 are the results when the time to perform CVD is set to 2 hours.

As shown in FIG. 6, in the CVD for forming the thin film 420a, when the ratio of argon is set to 5% or more, preferably 10% to 15%, the generation rate and the generation speed of the NV center of diamond increases as compared with the conventional ones (a white dot). That is, when the ratio of argon is 15%, the NV generation rate is about 3%, which is an improvement by a factor of about eight as compared with the conventional one. In addition, the generation speed is 8 μm/h, which is an improvement by a factor of 16 as compared with the conventional one. This indicates that the measurement sensitivity of the thin film 420a is improved by a factor of 11 as compared with the conventional one.

It should be noted that when the ratio of argon is 15%, the conditions of the CVD for forming the thin film 420a are as follows: when the total flow rate of the gas is set to 100 sccm or the like, for example, the ratio of methane $CH_4$ is set to 0.4%, the ratio of nitrogen N to carbon C is set to 0.8, the microwave irradiation energy is set to 520 W, the temperature is set to 950° C., and the pressure is set to 30 kPa.

In addition, as shown in FIG. 6, when the ratio of argon is 30%, crystallinity of diamond is reduced and the NV generation rate is decreased due to the influence of excessive argon.

Figure 7A:
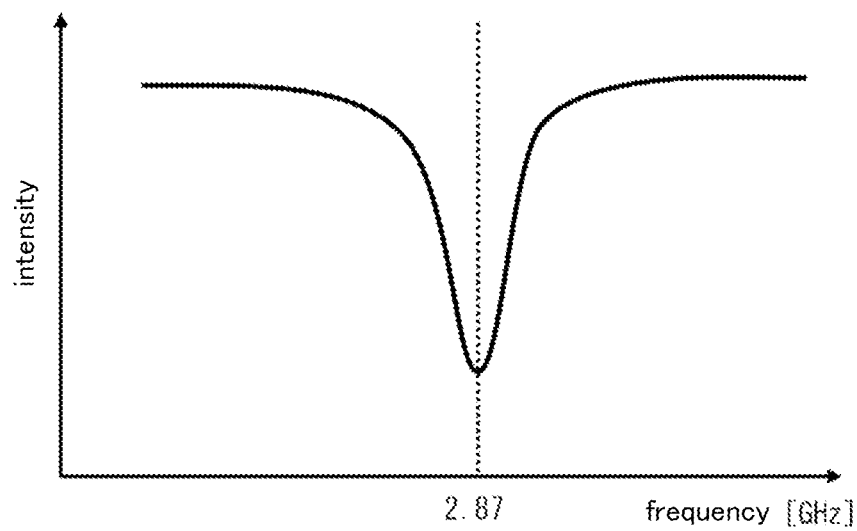
FIG. 7A is a diagram illustrating a case in which no magnetic field exists in the NV center of the thin film.
Figure 7B:
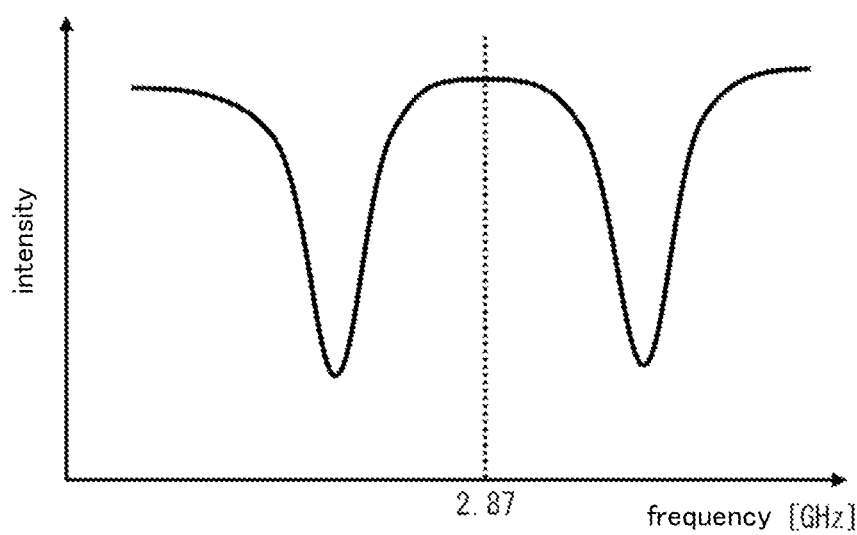
FIG. 7B is a diagram illustrating a case in which a magnetic field exists in the NV center of the thin film.

FIG. 7 shows graphs for illustrating the frequency dependence of the intensity of the fluorescent light emitted by the NV center of the thin film 420a shown in FIGS. 3 and 4. FIG. 7 shows the intensity of the fluorescent light emitted by the NV center, that is, an intensity distribution of the ODMR signal when the microwave irradiation system 44 (FIG. 3) irradiates the NV center included in the thin film 420a of the integrated circuit 4 with a microwave having a frequency in a predetermined range with a center frequency of 2.87 GHz. Note that FIG. 7A shows a case in which no magnetic field exists in the NV center of the thin film 420a, and FIG. 7B shows a case in which a magnetic field exists in the NV center of the thin film 420a. In addition, the horizontal axis in FIG. 7 represents the frequency of the microwave, and the vertical axis represents the intensity of the fluorescent light.

As shown in FIG. 7A, when no magnetic field exists in the NV center, that is, when the spin sublevel ms of ±1 is degenerated, the intensity of the fluorescent light is the lowest at a position of the frequency of 2.87 GHz (energy level difference when the spin sublevels ms are 0 and ±1).

On the other hand, when a magnetic field exists in the NV center, the spin sublevel ms further splits between −1 and +1. For this reason, as shown in FIG. 7B, the intensity of the fluorescent light is the lowest at two frequency positions corresponding to the energy level difference between the spin sublevels ms of 0 and −1 and the energy level difference between the spin sublevels ms of 0 and +1, respectively. Then, as the magnetic field increases, the energy level difference between the spin sublevels ms of −1 and +1 increases, so that the interval between the two frequencies, at which the intensity of the fluorescent light is reduced, increases. For example, the control unit 14 of the sensor system 1 (FIG. 1) measures a magnitude of the magnetic field detected by the thin film 420a by using the interval between the two frequencies detected via the detector 22 and the detection unit 46 (FIG. 3), and the expression (2) (see L. Rondin et al., "Magnetometry with nitrogen-vacancy defects in diamond", Rep. Prog. Phys., Vol. 77, 056503, 2014).

$$v_{\pm} = D + g\mu_B B_{NV}/h \tag{2}$$

$v_{\pm}$ represents the frequency at which the emission intensity is the lowest, and $B_{NV}$ represents the magnetic field in the NV center, $\mu B$ represents Bohr magneton, g represents Lande's g factor, and h represents Planck's constant. D is about 2.87 GHz.

It should be noted that the control unit 14 of the sensor system 1 may measure the electric field by using the interval between the two frequencies detected via the detection unit 46 and the change in the resonance frequency. In addition, the control unit 14 of the sensor system 1 may measure a temperature or the like from the intensity of the fluorescent light emitted by the thin film 420a, instead of the magnetic field or the electric field.

It should be noted that as shown in FIG. 5, there are four directions in which carbon C is covalently bonded. For this reason, the direction of the NV center generated in the thin film 420a is any one of the four directions. Then, in order for the thin film 420a to have a predetermined measurement sensitivity, for example, in order for the thin film 420a to have a predetermined measurement sensitivity in the case of FIGS. 3 and 4, it is desirable that the NV centers are aligned in the Z-axis direction. Note that the ratio at which the NV centers are aligned in the same direction is called an "NV orientation ratio". In order to improve the NV orientation ratio, it is preferable that the thin film 420a, that is, the plane orientation of the diamond is a {111} plane. Having all NV centers aligned in the same direction and making the NV orientation ratio 100% is effective to enhance the measurement sensitivity. On the other hand, since the thin film 420a is generated 16 times faster as compared with the conventional one, not all NV centers may be aligned in the same direction, that is, the NV orientation ratio may be less than 100%.

Figure 8:
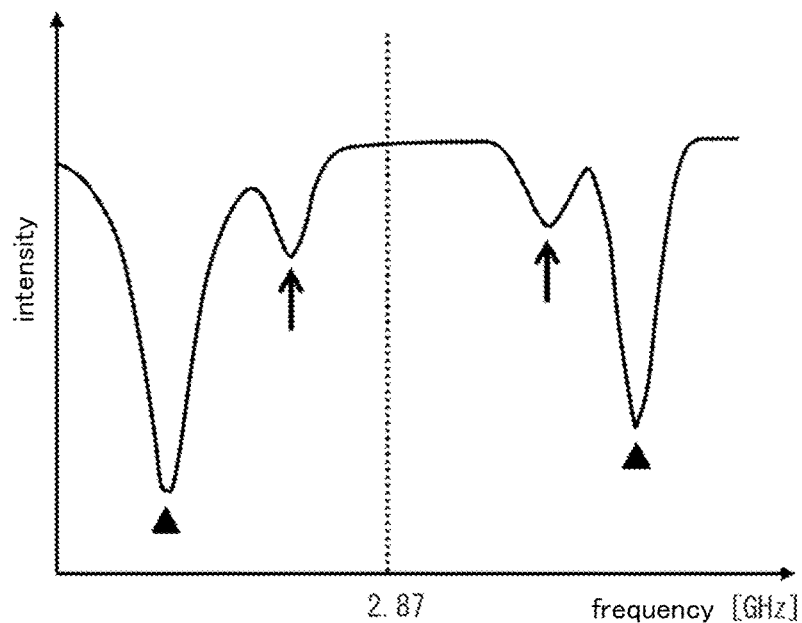
FIG. 8 is a graph illustrating the frequency dependence of the intensity of a fluorescent light emitted by the thin film shown in FIGS. 3 and 4 when the NV orientation ratio is 80%.

FIG. 8 is a graph illustrating the frequency dependence of the intensity of the fluorescent light emitted by the thin film 420a shown in FIGS. 3 and 4 when the NV orientation ratio is 80%. As in the case shown in FIG. 7, the horizontal axis of FIG. 8 represents the frequency, and the vertical axis represents the intensity of the fluorescent light. In addition, FIG. 8 shows a case in which a magnetic field exists in the NV center of the thin film 420a, as in the case illustrated in FIG. 7B.

As shown in FIG. 8, as in the case shown in FIG. 7B, the intensity of the fluorescent light is the lowest at two frequency positions indicated by the triangles corresponding to the energy level difference between the spin sublevels ms of 0 and −1 and the energy level difference between the spin sublevels ms of 0 and +1, respectively. In addition, as shown in FIG. 8, the intensity of the fluorescent light is also reduced at two frequency positions indicated by the arrows. This shows a reduction in intensity due to the NV center in the direction different from the Z-axis direction among the NV centers included in the thin film 420a. However, the intensity changes at the two frequency positions indicated by the triangles are larger as compared with the intensity changes at the two frequency positions indicated by the arrows. For this reason, by using the thin film 420a having an NV orientation ratio of at least larger than 25%, preferably 50% or more, more preferably 80% or more, the sensor system 1 (FIG. 1) can measure a magnetic field with sufficient accuracy.

Next, four modifications of the diamond semiconductor 42a will be described. Each of the modifications of the diamond semiconductor 42a also has a function as an electric circuit that is a part of a detection unit for detecting a change in conductivity (or current) of the diamond film.

In addition, in the modifications of the diamond semiconductor 42a, since the state of the electron spin can be detected by electricity in place of the above-described light intensity, the signal intensity is not saturated even at a high excitation light intensity. In addition, the electrical detection is considered to have higher sensitivity than the optical detection described above (theoretical prediction: see F. M. Hrubesch et al., Phys. Rev. Lett. 118, 037601(2017)). Furthermore, the electrical detection also contributes to the integration of the integrated circuit 4.

Figure 9:
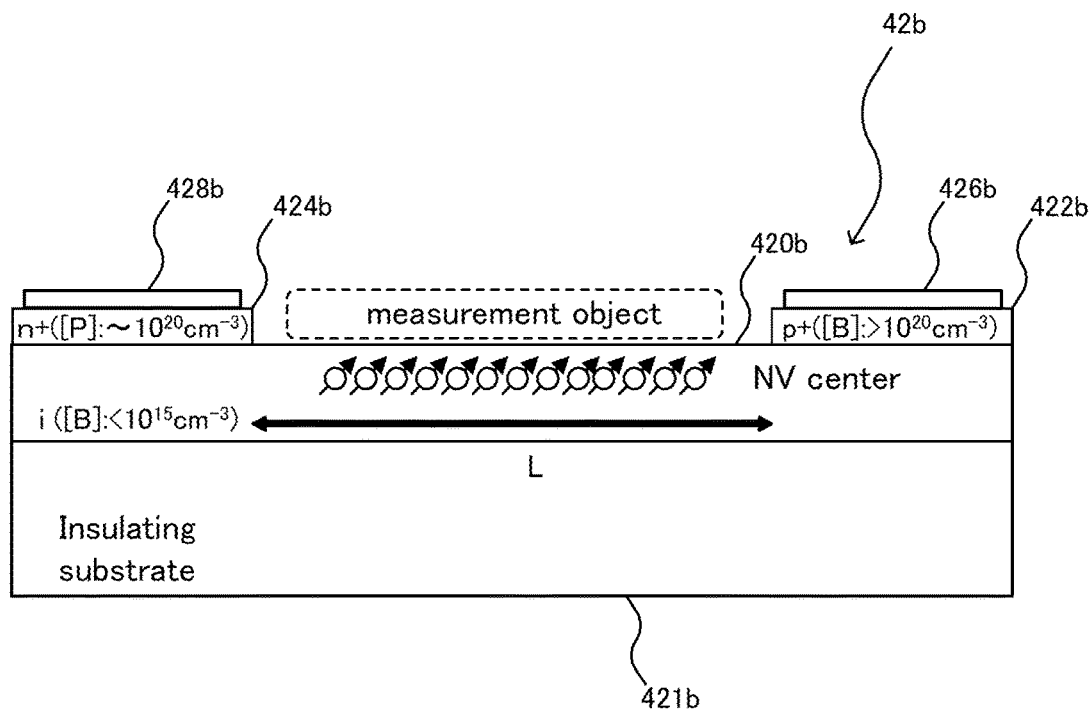
FIG. 9 is a diagram schematically illustrating a cross section of a first modification of the diamond semiconductor.

Hereinafter, the four modifications of the diamond semiconductor 42a will be specifically described. FIG. 9 is a diagram schematically illustrating a cross section of a first modification (diamond semiconductor 42b) of the diamond semiconductor 42a.

The diamond semiconductor 42b is an intrinsic semiconductor (i-type semiconductor), in which a thin film 420b including an NV center is formed on an insulating substrate 421b. On the thin film 420b, a P-type semiconductor 422b and an N-type semiconductor 424b are provided at positions, for example, where a measurement object can be sandwiched.

The P-type semiconductor 422b is a semiconductor in which diamond is doped with, for example, a boron impurity, and is provided with a metal electrode 426b. The N-type semiconductor 424b is a semiconductor in which diamond is doped with, for example, a phosphorus impurity, and is provided with a metal electrode 428b.

In the diamond semiconductor 42b, an interval L between the P-type semiconductor 422b and the N-type semiconductor 424b, and an i-layer concentration are designed such that the thin film 420b becomes depleted when a reverse bias is applied to the electrodes 426b and 428b from an external power supply.

That is, the diamond semiconductor 42b is a PIN (p-intrinsic-n) diode made of diamond, and electron multiplication occurs due to avalanche breakdown when a high reverse bias is applied.

Figure 10:
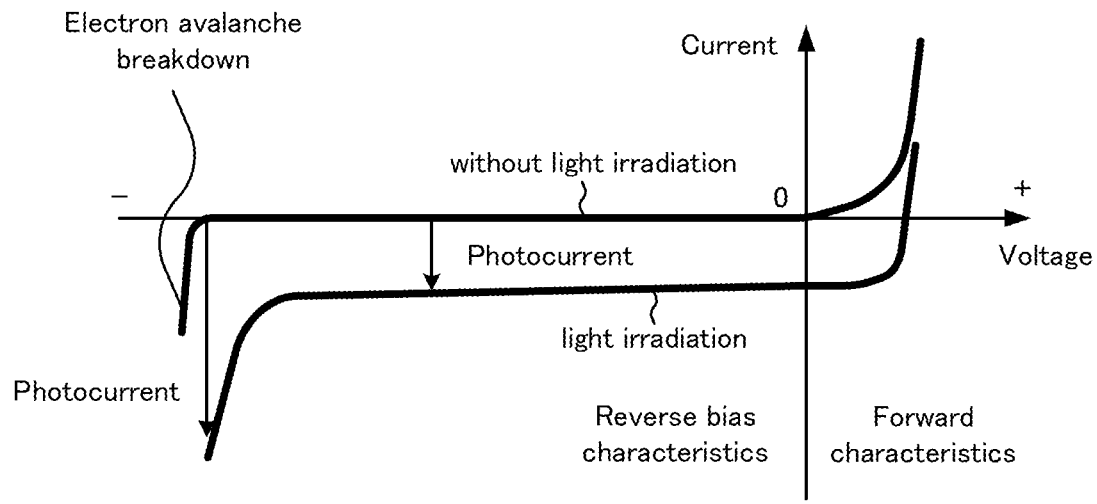
FIG. 10 is a graph illustrating multiplication of currents due to avalanche breakdown in the diamond semiconductor.
Figure 11:
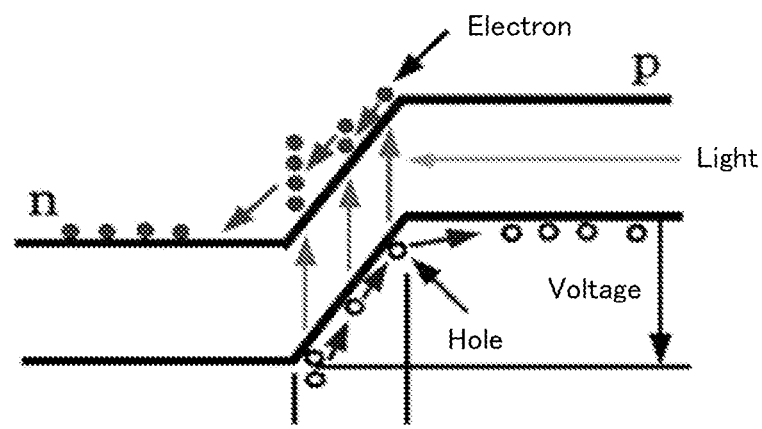
FIG. 11 is a diagram illustrating a process of avalanche amplification.

FIG. 10 is a graph illustrating multiplication of currents due to avalanche breakdown in the diamond semiconductor 42b. FIG. 11 is a diagram illustrating a process of avalanche amplification. As shown in FIG. 10, in the diamond semiconductor 42b, when the applied reverse bias increases, a current suddenly starts to flow due to the electron avalanche breakdown. At this time, in the diamond semiconductor 42b in the case of with light irradiation, since the electron avalanche is caused by the process shown in FIG. 11, a photocurrent starts to increase at a voltage higher than the voltage at which the breakdown starts in the case of without light irradiation. That is, in the diamond semiconductor 42b, since the avalanche breakdown can cause a large photocurrent to flow, sensitivity as that of the detection unit becomes higher.

In addition, since the diamond semiconductor 42b has a low impurity concentration, the phase coherence time of the electron spin of the NV center can be extended. In addition, the diamond semiconductor 42b has a small dark current in the case of without light irradiation, which is effective in improving sensitivity.

It should be noted that the contact resistance of the diamond semiconductor 42b is reduced by the high concentration doped layer. Then, in the diamond semiconductor 42b, a fraction of electrons that have transitioned to the excited state by the excitation light can be further transitioned to a conduction band by the excitation light, which makes it easy to take out the photocurrent from outside. In addition, in the diamond semiconductor 42b, the photocurrent decreases at the vicinity of the resonance frequency of the microwave. That is, the diamond semiconductor 42b makes it possible to measure photoelectric detection of magnetic resonance (PDMR, which will be described later with reference to FIG. 16 and the like) by measuring the photocurrent while sweeping the microwaves so as to search for a resonance frequency.

Figure 12:
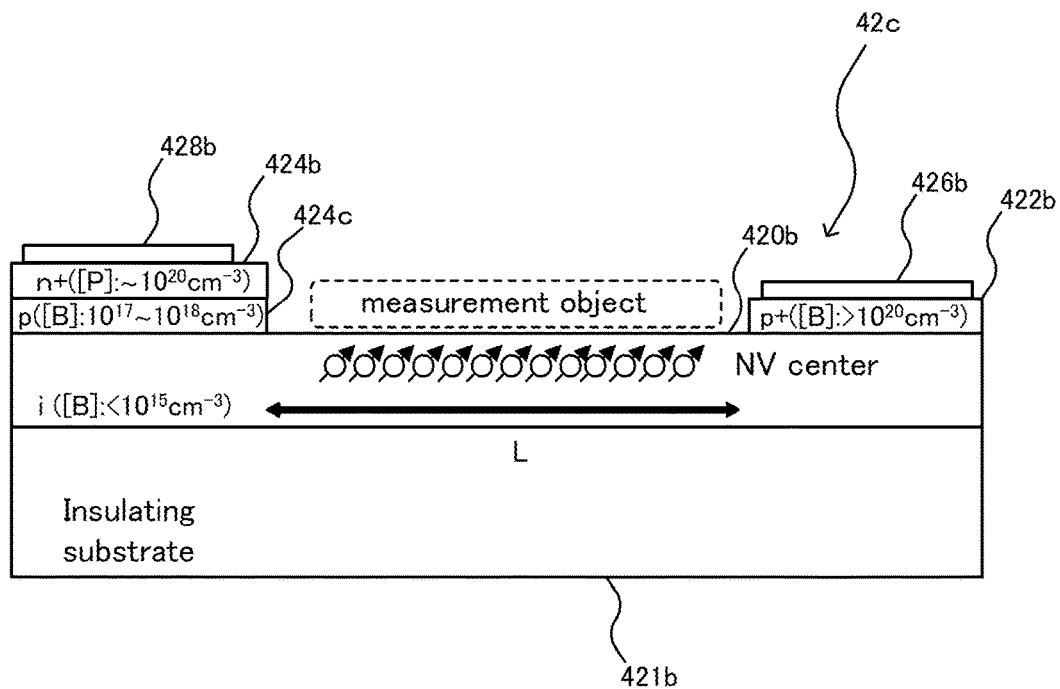
FIG. 12 is a diagram schematically illustrating a cross section of a second modification of the diamond semiconductor.

FIG. 12 is a diagram schematically illustrating a cross section of a second modification (diamond semiconductor 42c) of the diamond semiconductor 42a.

Figure 13:
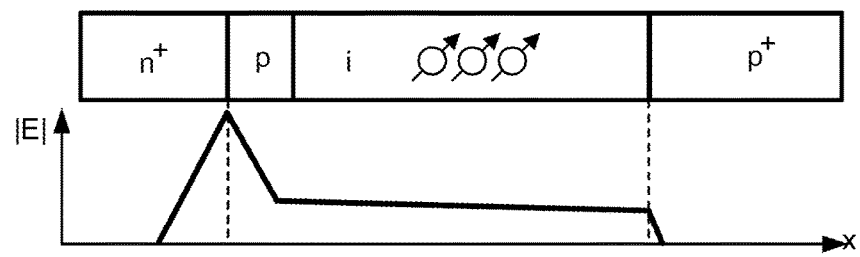
FIG. 13 is a diagram illustrating a reach-through structure in which an NV center forming region and a carrier multiplication region are separated.

The diamond semiconductor 42c has a configuration in which a P-type semiconductor 424c is further stacked between the thin film 420b and the N-type semiconductor 424b in the diamond semiconductor 42b described above. That is, the diamond semiconductor 42c has a reach-through structure in which an NV center forming region and a carrier multiplication region are separated as shown in FIG. 13. The reach-through structure has a configuration in which a p-layer is inserted between an $n^+$ layer and an i-layer, which separates the NV center forming region and the carrier multiplication region. Then, in the diamond semiconductor 42c, an avalanche voltage is designed by setting the p-layer concentration.

In general, when a high voltage is applied to the NV center to cause avalanche breakdown, the charge state may be changed. In order for the diamond semiconductor 42c to have the function of the detection unit, it is necessary that the NV center is in a negatively charged state. For this reason, the diamond semiconductor 42c has a reach-through structure to separate between the NV center formation region and a high electric field region that serves as a carrier multiplication region (FIG. 13).

Figure 14:
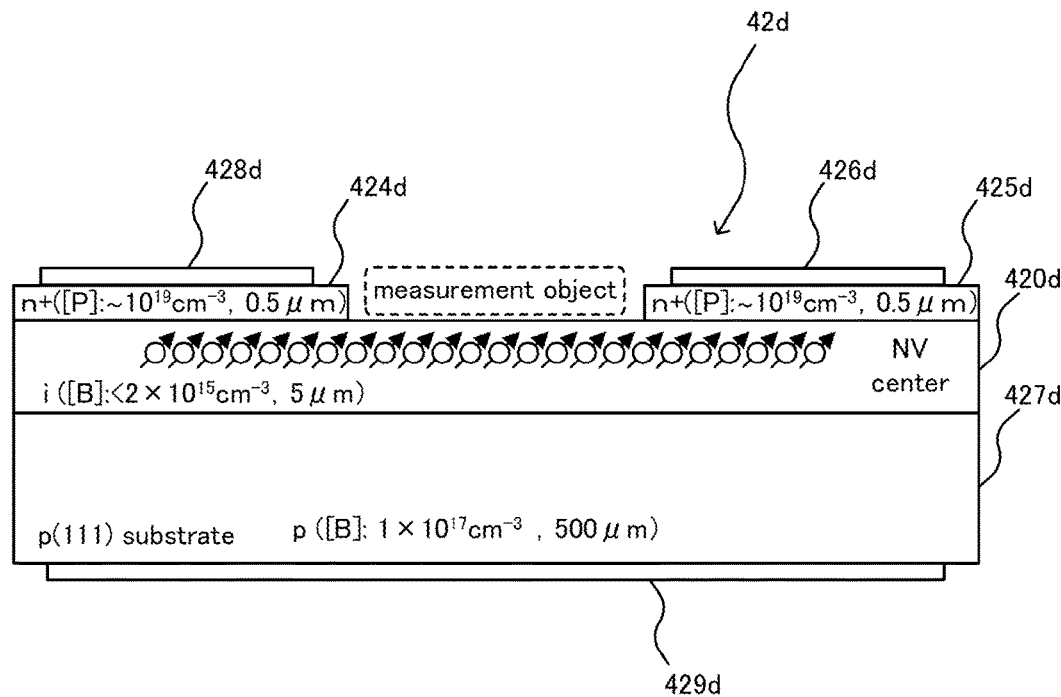
FIG. 14 is a diagram schematically illustrating a cross section of a third modification of the diamond semiconductor.

FIG. 14 is a diagram schematically illustrating a cross section of a third modification (diamond semiconductor 42d) of the diamond semiconductor 42a.

The diamond semiconductor 42d is an intrinsic semiconductor (i-type semiconductor), in which a thin film 420d including an NV center and having a thickness of, for example, 5 μm is formed on a p(111) substrate 427d. The p(111) substrate 427d is doped with, for example, a boron impurity, has a thickness of, for example, 500 μm, and is provided with an electrode 429d below.

In addition, on the thin film 420d, an N-type semiconductor 424d and an N-type semiconductor 425d are provided at positions, for example, where a measurement target can be sandwiched.

The N-type semiconductor 424d is a semiconductor doped with, for example, a phosphorus impurity and having a thickness of 0.5 μm, and is provided with a metal electrode 428d. The N-type semiconductor 425d is a semiconductor doped with, for example, a phosphorus impurity and having a thickness of 0.5 μm, and is provided with a metal electrode 426d. In the diamond semiconductor 42d, the electrodes 426d and 428d are cathodes, and the electrode 429d is an anode.

As described above, the diamond semiconductor 42d is a vertical PIN diode formed of diamond, in which electron multiplication occurs due to avalanche breakdown when a high reverse bias is applied.

Figure 15:
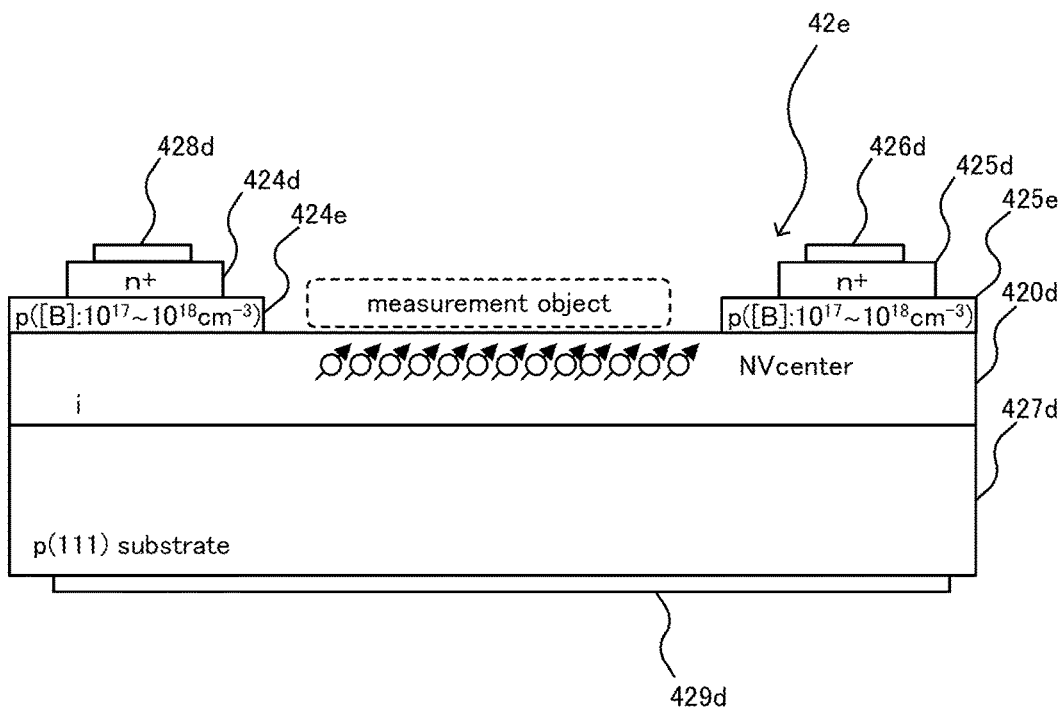
FIG. 15 is a diagram schematically illustrating a cross section of a fourth modification of the diamond semiconductor.

FIG. 15 is a diagram schematically illustrating a cross section of a fourth modification (diamond semiconductor 42e) of the diamond semiconductor 42a.

The diamond semiconductor 42e has a configuration in which a P-type semiconductor 424e is further stacked between the thin film 420d and the N-type semiconductor 424d in the diamond semiconductor 42d described above, and a P-type semiconductor 425e is further stacked between the thin film 420d and the N-type semiconductor 425d.

That is, the diamond semiconductor 42e is a vertical PIN diode having the above-described reach-through structure and separating the NV center forming region and the carrier multiplication region, in which electron multiplication occurs due to avalanche breakdown when a high reverse bias is applied.

Figure 16:
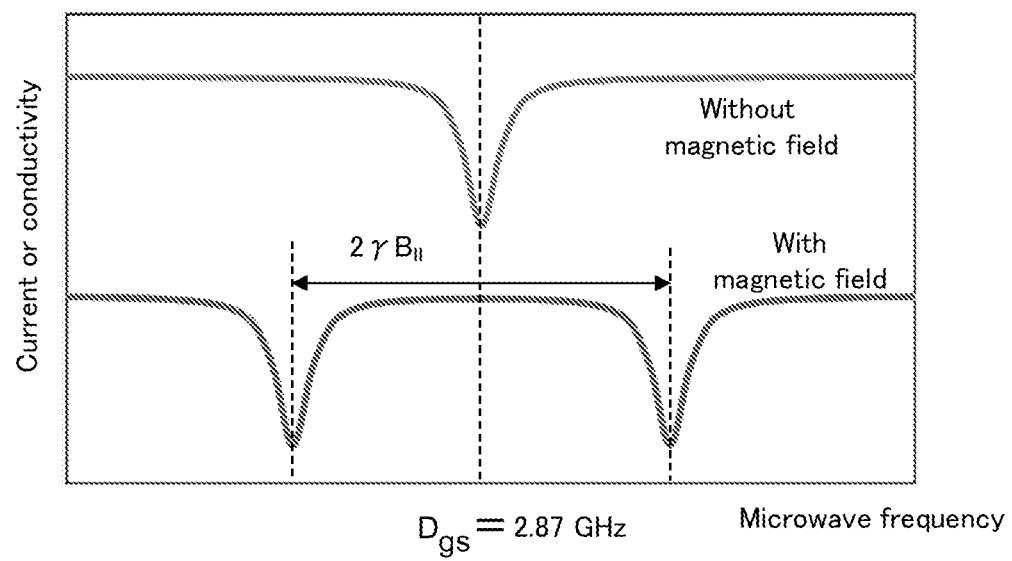

FIG. 16 is a graph illustrating characteristics of the photoelectric detection of magnetic resonance (PDMR) of the diamond semiconductor 42a, the modifications thereof, and the like. While the above-described ODMR characteristics (see FIG. 8 and the like) show the frequency dependence of the intensity of the fluorescent light emitted from the thin film, the PDMR characteristics shown in FIG. 16 show the frequency dependence of the current or the conductivity.

The NV center in diamond forms an energy level in the band gap. While electrons trapped at this level and brought to the ground state transition to the excited state by the excitation light of 532 nm, a fraction of electrons transition further to the conduction band by the excitation light.

These electrons reflect the spin state of the NV center, and the electron in the state of ms=±1 hardly contributes to the photocurrent. This is because the excitation lifetime of the electron that has transitioned to the excited state of ms=±1 is shorter than that of the case in which ms=0.

The diamond semiconductor 42a and the modifications thereof allow the electron excited into the conduction band to be taken out to an external circuit as a photocurrent. That is, the diamond semiconductor 42a and the modifications thereof allow the spin state of the NV center to be electrically read.

In the diamond semiconductor 42a and the modifications thereof, a transition can be made between the two levels of ms=0 and ms=1, or ms=0 and ms=−1 by emitting a microwave that corresponds to a resonance frequency.

It should be noted that when the spin state of the NV center is electrically detected, if the dark current is larger than the photocurrent derived from the NV center, the dark current may be removed by using a lock-in amplifier after the excitation light is pulsated and the photocurrent is converted into a voltage by I/V conversion.

Next, a modification of the integrated circuit 4 will be described.

Figure 17:
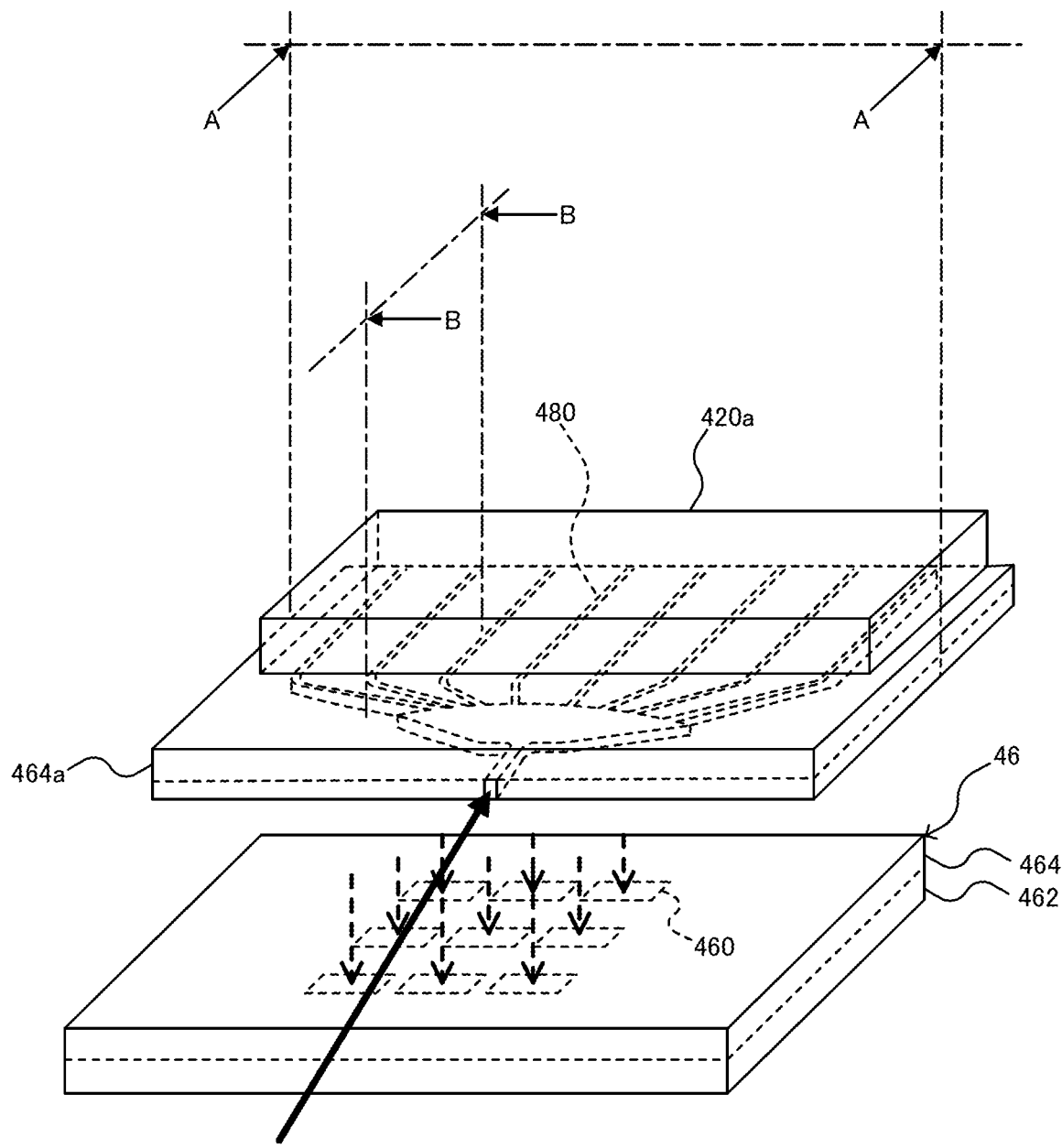
FIG. 17 is a diagram schematically illustrating a configuration example of a periphery of the thin film and the detection unit in the modification of the integrated circuit according to one embodiment.
Figure 18A:
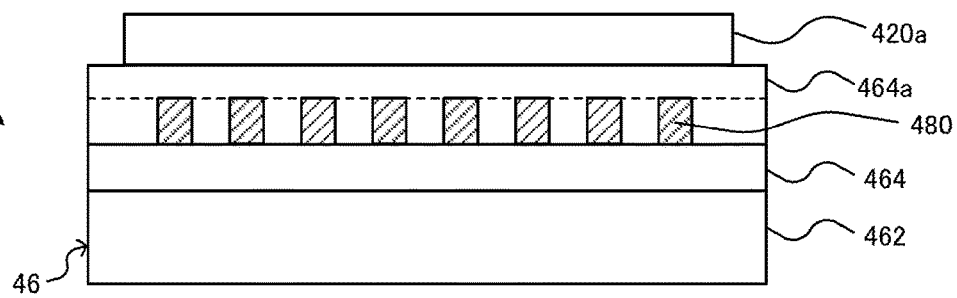
FIG. 18A is a diagram schematically illustrating a cross section taken along a line A-A in the periphery of the thin film and the detection unit shown in FIG. 17.
Figure 18B:
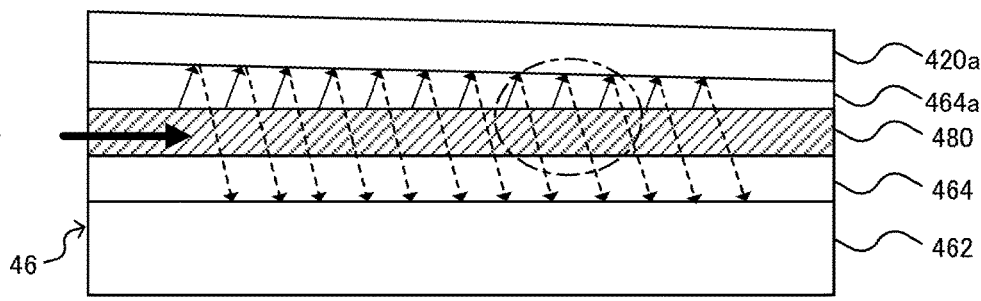
FIG. 18B is a diagram schematically illustrating a cross section taken along a line B-B in the periphery of the thin film and the detection unit shown in FIG. 17.
Figure 18C:
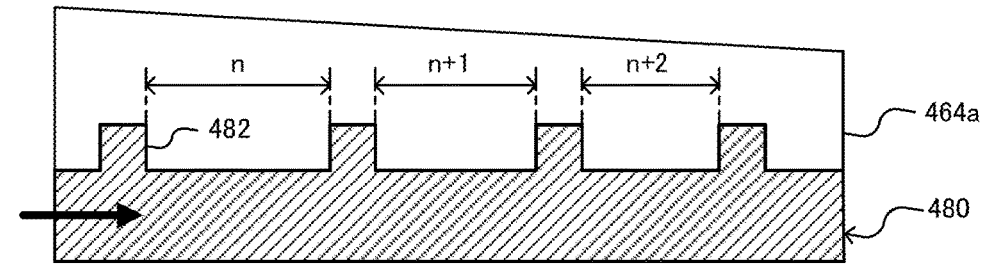
FIG. 18C is a diagram enlarging and schematically illustrating a region shown in FIG. 18B that is surrounded by an alternate long and short dash line.

FIG. 17 is a diagram schematically illustrating a configuration example of a periphery of the thin film 420a and the detection unit 46 in the modification of the integrated circuit 4 according to one embodiment. FIG. 18 shows enlarged views relating to the periphery of the thin film 420a and the detection unit 46 shown in FIG. 17. FIG. 18A is a diagram schematically illustrating a cross section taken along a line A-A in the periphery of the thin film 420a and the detection unit 46 shown in FIG. 17. FIG. 18B is a diagram schematically illustrating a cross section taken along a line B-B in the periphery of the thin film 420a and the detection unit 46 shown in FIG. 17. FIG. 18C is a diagram enlarging and schematically illustrating a region shown in FIG. 18B that is surrounded by an alternate long and short dash line.

As shown in FIGS. 17 and 18, in the modification of the integrated circuit 4, an oxide film 464a is formed below the thin film 420a. In addition, the detection unit 46 is, for example, a two-dimensional CMOS sensor, and has a configuration in which an oxide film 464 is formed on a light receiving layer 462 on which a PD is formed.

In addition, in the modification of the integrated circuit 4, a nitride film 480 is formed such that the nitride film 480 is surrounded by the oxide films 464 and 464a. The nitride film 480 is formed to serves as, for example, a star coupler that guides an excitation light in a plurality of directions when the excitation light is made incident from one place through an optical fiber (not shown) or the like in the direction indicated by the thick arrow in FIGS. 17 and 18.

That is, the modification of the integrated circuit 4 has a waveguide formed therein in which the nitride film 480 is a core layer and the oxide films 464a and 464 are clad layers, and has a configuration in which the excitation light made incident in the direction indicated by the thick arrow substantially uniformly irradiates (excites) the entire thin film 420a.

For example, as shown in FIG. 18B, the oxide film 464a is formed such that the thickness of the region sandwiched between the nitride film 480 and the thin film 420a becomes gradually thinner as the excitation light made incident from outside advances in the light guide direction (X direction).

In addition, as shown in FIG. 18C, in the nitride film 480, diffraction gratings 482 are formed at predetermined intervals in the light guide direction (X direction) of the excitation light. The diffraction gratings 482 are formed periodically, for example, such that the intervals are narrower as the excitation light made incident from outside advances in the light guide direction (X direction). For example, the interval of the (n+1)-th diffraction grating 482 shown in FIG. 18C is made shorter than the interval of the n-th diffraction grating 482. In addition, the interval of the (n+2)-th diffraction grating 482 is made shorter than the interval of the (n+1)-th diffraction grating 482.

It should be noted that only one of the thickness of the oxide film 464a and the interval of the diffraction grating 482 may be modulated such that the excitation light applied to each position in the XY direction of the thin film 420a is substantially uniform. In addition, the waveguide formed in the modification of the integrated circuit 4 and the thin film 420a may be configured to optically resonate.

Then, in the modification of the integrated circuit 4, the detection unit 46 detects a red light emitted by the thin film 420a when the electron is excited by the excitation light in the thin film 420a and the electron in the excited state transitions to the ground state. As described above, in the modification of the integrated circuit 4, the electron is excited by the excitation light in the thin film 420a, and the detection unit 46 optically detects the change in the intensity of the red light.

It should be noted that in the examples shown in FIGS. 17 and 18, the thin film 420a may be configured to be able to detect the change in the conductivity. That is, the thin film 420a may also have a function as an electric circuit that is a part of the detection unit for detecting the change in the conductivity as an electric signal that changes in accordance with a change in the frequency of the microwave, so as to output the electric signal to the control unit 14.

In addition, the detection unit 46 may be configured as an electric circuit for detecting a change in the conductivity of the thin film 420a as an electric signal that changes in accordance with a change in the frequency of the microwave, so as to output the electric signal to the control unit 14. Further, in the modification of the integrated circuit 4, the detection unit 46 may electrically detect a change when an electron is excited by the excitation light in the thin film 420a and the electron transitions from the excited state to the ground state.

It should be noted that each of the above-described embodiments is a configuration example of the sensor system 1, and a combination of the above-described respective configurations may be arbitrarily changed. For example, in the sensor system 1, an electron may be excited by either light or electricity, and may detect a change in a magnetic field or the like by either light or electricity.

In addition, the integrated circuit 4 is configured to have the thin film 420a, the microwave irradiation system 44 that irradiates the thin film 420a with a microwave in response to driving from outside, the excitation unit (the configuration shown in FIGS. 3, 17, and the like) that excites the electron included in the thin film 420a by excitation light or electricity in response to driving from outside, and the detection unit 46 that detects, as an electric signal that changes in accordance with a change in the frequency of the microwave, at least either one of the intensity of the light outputted from the thin film 420a when the electron transitions from the excited state to the ground state and the conductivity.

It should be noted that in the above-described sensor system 1, it is desirable that the number density of the NV center is in the range of from 1 $cm^{-3}$ to $10^{20}$ $cm^{-3}$.

Next, another configuration example of the sensor system 1 will be described.

Figure 19:
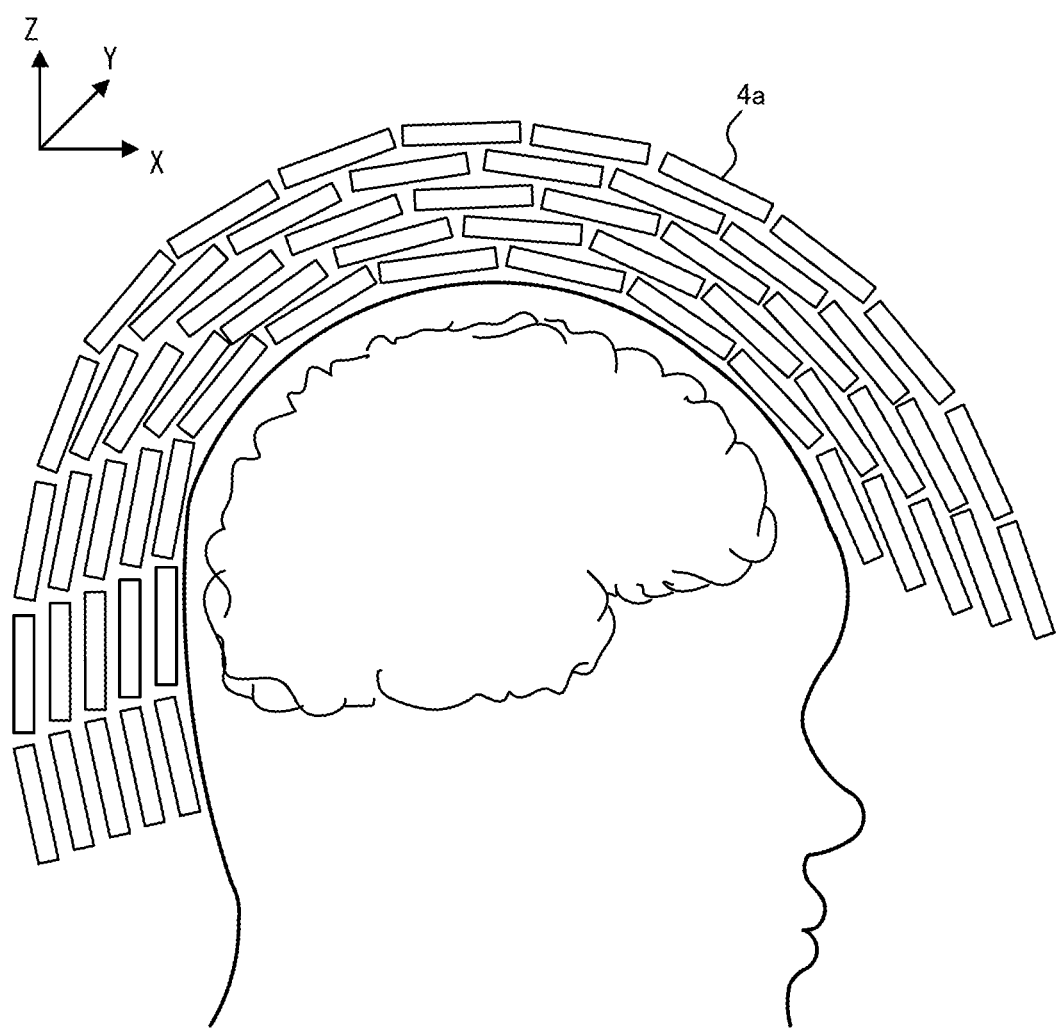
FIG. 19 is a schematic diagram schematically illustrating another configuration example of the sensor system.

FIG. 19 is a schematic diagram schematically illustrating another configuration example of the sensor system 1. As shown in FIG. 19, the sensor system 1 is provided with, for example, a plurality of sensor modules 4a. Each of the plurality of sensor modules 4a has an integrated circuit 4 (see FIG. 3 and the like), and can be arranged in an array on the surface of a measurement target, for example, a human head or the like. In addition, the sensor modules 4a (or the integrated circuits 4) may be stacked in a plurality of layers as shown in FIG. 11 and arranged on a measurement target, or may be arranged in an array in one layer. Then, the sensor system 1 provided with the plurality of sensor modules 4a may be configured to detect a three-dimensional magnetic field also including the depth direction of the head with high sensitivity. A gradiometer can be configured further with a plurality of layers of sensors to achieve high sensitivity.

That is, the sensor system 1 allows information in a brain to be measured non-invasively and with high sensitivity by arranging the plurality of miniaturized sensor modules 4a in an array on a measurement target such as a human head. Then, the sensor system 1 can obtain more detailed information in the depth direction in the brain by arranging the plurality of sensor modules 4a at a fixed distance from the surface of the human head.

As described above, according to the embodiments described above, it is possible to reduce the size while increasing the detection sensitivity to a magnetic field or the like by utilizing the optically detected magnetic resonance or the photoelectric detection of magnetic resonance.

Then, it is possible to apply the sensor system 1 in a wide variety of ways to enable scalable measurement, such as measurement of magnetoencephalogram, magnetocardiogram, and magnetospinogram of a living body, measurement of a current and a temperature of a cell, measurement of a neural network, and measurement of a current and a temperature of a battery and a power device, at normal temperature and room temperature.

REFERENCE SIGNS LIST

1 Sensor system
2, 2a, 2b, 2c Probe
3, 3a, 3b, 4 Integrated circuit
10 Input unit
12 Output unit
14 Control unit
20 Light source
22 Detector
30, 42a, 42b, 42c, 42d, 42e Diamond semiconductor
32, 44 Microwave irradiation system
40 Silicon substrate
46 Detection unit
140 CPU
142 Memory
420a, 420b, 420d Thin film
421b Insulating substrate
422a, 422b, 424c, 424e P-type semiconductor
424a, 424b, 424d, 425d N-type semiconductor
426a, 426b, 426d, 428a, 428b, 428d, 429d Electrode
427d P(111) substrate
440 Microwave generation circuit
442 Antenna
460 Light receiving unit
462 Light receiving layer
464, 464a Oxide film
480 Nitride film
482 Diffraction grating

The invention claimed is:

1. An integrated circuit, comprising:
a PIN diode formed of a wide band semiconductor that has a band gap of 2.2 eV or more, having a P-type semiconductor (P), an N-type semiconductor (N), and a thin film that is a semiconductor (I) provided between the P-type semiconductor and the N-type semiconductor and having a lower impurity concentration than those of the P-type semiconductor and the N-type semiconductor, and in which a crystal includes a composite defect of an impurity atom and a vacancy;
a microwave irradiation system configured to irradiate the thin film with a microwave;
an excitation unit configured to excite the thin film; and
a detector configured to detect a change in conductivity of the thin film when transitioning from an excited state to a ground state.

2. The integrated circuit according to claim 1, wherein the thin film is a diamond film provided with a region including a composite defect (an NV center) of nitrogen (N) that has replaced a carbon atom and a vacancy (V) adjacent to the nitrogen.

3. The integrated circuit according to claim 1, wherein the detector in which the thin film constitutes part of a circuit configured to detect changes in the conductivity of the thin film as electrical signals.

4. The integrated circuit according to claim 1, wherein the detector is configured to perform detection as a current between terminals of the PIN diode.

5. The integrated circuit according to claim 1, wherein the detector is configured to perform detection by applying a zero or reverse bias voltage between the terminals of the PIN diode.

6. The integrated circuit according to claim 5, wherein:
with respect to the thin film, the P-type semiconductor, and the N-type semiconductor, the P-type semiconductor and the N-type semiconductor are arranged on the thin film at an interval; and
with respect to the PIN diode, an interval between the P-type semiconductor and the N-type semiconductor and the impurity concentrations of the P-type semiconductor, the N-type semiconductor, and the thin film are designed such that the thin film becomes depleted to cause avalanche breakdown when a reverse bias voltage is applied.

7. The integrated circuit according to claim 1, wherein the excitation unit is configured to excite an electron by irradiating the thin film with an excitation light.

8. The integrated circuit according to claim 1, wherein the excitation unit is configured to excite an electron by applying a forward bias voltage between the terminals of the PIN diode.

9. The integrated circuit according to claim 1, wherein with respect to the thin film, the P-type semiconductor, and the N-type semiconductor, the P-type semiconductor, the thin film, and the N-type semiconductor are arranged side by side on a same plane such that the P-type semiconductor and the N-type semiconductor sandwich the thin film.

10. The integrated circuit according to claim 1, wherein with respect to the thin film, the P-type semiconductor, and the N-type semiconductor, the P-type semiconductor and the N-type semiconductor are arranged on the thin film at an interval.

11. The integrated circuit according to claim 1, wherein the thin film is diamond including a composite defect (an NV center) of nitrogen (N) that has replaced a carbon atom and a vacancy (V) adjacent to the nitrogen, diamond including SiV, SnV, PbV, and GeV, or silicon carbide (SiC), gallium nitride (GaN), zinc oxide (ZnO), aluminum nitride (AlN), boron nitride (BN), or gallium oxide ($Ga_2O_3$) that has an atomic vacancy in a crystal thereof.

12. A sensor system provided with a plurality of the integrated circuits according to claim 1, wherein the plurality of the integrated circuits can be arranged in an array on a surface or in a depth direction of a measurement target.

13. The integrated circuit according to claim 1, wherein with respect to the thin film, the P-type semiconductor, and the N-type semiconductor, the thin film is arranged on the P-type semiconductor, and the N-type semiconductor is arranged on the thin film.

14. An integrated circuit, comprising:
a PIN diode formed of a wide band semiconductor that has a band gap of 2.2 eV or more, having a P-type semiconductor (P), an N-type semiconductor (N), and a thin film that is a semiconductor (I) provided between the P-type semiconductor and the N-type semiconductor and having a lower impurity concentration than those of the P-type semiconductor and the N-type semiconductor, and in which a crystal includes a composite defect of an impurity atom and a vacancy;
a microwave irradiation system configured to irradiate the thin film with a microwave;
an excitation unit configured to excite the thin film; and
a detector configured to detect at least either one of an intensity of light outputted from the thin film when transitioning from an excited state to a ground state and a change in conductivity of the thin film,
wherein the thin film, the P-type semiconductor, and the N-type semiconductor further include a second P-type semiconductor provided between the thin film and the N-type semiconductor, and comprises a reach-through structure that separates a region in which a crystal includes a composite defect of an impurity atom and a vacancy and a region in which carrier increase is caused when a reverse bias voltage is applied.

15. The integrated circuit according to claim 14, wherein with respect to the PIN diode, an interval between the P-type semiconductor and the N-type semiconductor, the impurity concentrations of the P-type semiconductor, the N-type semiconductor, and the thin film, and an impurity concentration of the second P-type semiconductor are designed such that the thin film becomes depleted to cause avalanche breakdown when a reverse bias voltage is applied.

16. The integrated circuit according to claim 14, wherein with respect to the thin film, the P-type semiconductor, and the N-type semiconductor, the P-type semiconductor and the N-type semiconductor are arranged on the thin film at an interval.

17. The integrated circuit according to claim 14, wherein with respect to the thin film, the P-type semiconductor, and the N-type semiconductor, the thin film is arranged on the P-type semiconductor, and the N-type semiconductor is arranged on the thin film.

18. The integrated circuit according to claim 14, wherein the thin film is diamond including a composite defect (an NV center) of nitrogen (N) that has replaced a carbon atom and a vacancy (V) adjacent to the nitrogen, diamond including SiV, SnV, PbV, and GeV, or silicon carbide (SiC), gallium nitride (GaN), zinc oxide (ZnO), aluminum nitride (AlN), boron nitride (BN), or gallium oxide ($Ga_2O_3$) that has an atomic vacancy in a crystal thereof.

19. A sensor system provided with a plurality of the integrated circuits according to claim 1, wherein the plurality of the integrated circuits can be arranged in an array on a surface or in a depth direction of a measurement target.

20. An integrated circuit, comprising:
a thin film that has a band gap of 2.2 eV or more and in which a crystal includes a composite defect of an impurity atom and a vacancy;
a microwave irradiation system configured to irradiate the thin film with a microwave;
an excitation unit configured to excite the thin film; and
a detector configured to detect at least either one of an intensity of light outputted from the thin film when transitioning from an excited state to a ground state and a change in conductivity of the thin film,
wherein the excitation unit is configured to irradiate the thin film with an excitation light made incident from outside through a waveguide having a core layer that transmits light by being sandwiched between clad layers that transmit light, and
wherein the clad layer is formed such that a thickness of a region sandwiched between the core layer and the thin film becomes gradually thinner as the excitation light advances in a light guide direction.

21. The integrated circuit according to claim 20, wherein the thin film is a diamond film provided with a region including a composite defect (an NV center) of nitrogen (N) that has replaced a carbon atom and a vacancy (V) adjacent to the nitrogen.

22. The integrated circuit according to claim 20, wherein the core layer comprises a diffraction grating formed therein so as to diffract the excitation light toward the thin film.

23. The integrated circuit according to claim 22, wherein the diffraction grating is formed such that a period thereof becomes shorter as the excitation light advances in a light guide direction.

24. The integrated circuit according to claim 20, wherein the thin film is diamond including a composite defect (an NV center) of nitrogen (N) that has replaced a carbon atom and a vacancy (V) adjacent to the nitrogen, diamond including SiV, SnV, PbV, and GeV, or silicon carbide (SiC), gallium nitride (GaN), zinc oxide (ZnO), aluminum nitride (AlN), boron nitride (BN), or gallium oxide ($Ga_2O_3$) that has an atomic vacancy in a crystal thereof.

25. A sensor system provided with a plurality of the integrated circuits according to claim 20, wherein the plurality of the integrated circuits can be arranged in an array on a surface or in a depth direction of a measurement target.

26. An integrated circuit, comprising:
a thin film that has a band gap of 2.2 eV or more and in which a crystal includes a composite defect of an impurity atom and a vacancy;
a microwave irradiation system configured to irradiate the thin film with a microwave;
an excitation unit configured to excite the thin film; and
a detector configured to detect at least either one of an intensity of light outputted from the thin film when transitioning from an excited state to a ground state and a change in conductivity of the thin film,
wherein the excitation unit is configured to irradiate the thin film with an excitation light made incident from outside through a waveguide having a core layer that transmits light by being sandwiched between clad layers that transmit light, and
wherein the core layer comprises a diffraction grating formed therein so as to diffract the excitation light toward the thin film.

27. The integrated circuit according to claim 26, wherein the thin film is a diamond film provided with a region including a composite defect (an NV center) of nitrogen (N) that has replaced a carbon atom and a vacancy (V) adjacent to the nitrogen.

28. The integrated circuit according to claim 26, wherein the thin film is diamond including a composite defect (an NV center) of nitrogen (N) that has replaced a carbon atom and a vacancy (V) adjacent to the nitrogen, diamond including SiV, SnV, PbV, and GeV, or silicon carbide (SiC), gallium nitride (GaN), zinc oxide (ZnO), aluminum nitride (AlN), boron nitride (BN), or gallium oxide ($Ga_2O_3$) that has an atomic vacancy in a crystal thereof.

29. A sensor system provided with a plurality of the integrated circuits according to claim 20, wherein the plurality of the integrated circuits can be arranged in an array on a surface or in a depth direction of a measurement target.

30. An integrated circuit, comprising:
a thin film that has a band gap of 2.2 eV or more and in which a crystal includes a composite defect of an impurity atom and a vacancy;
a microwave irradiation system configured to irradiate the thin film with a microwave;
an excitation unit configured to excite the thin film; and
a detector configured to detect at least either one of an intensity of light outputted from the thin film when transitioning from an excited state to a ground state and a change in conductivity of the thin film,
wherein the thin film is formed by chemical vapor deposition using a gas mixture containing approximately 10% to 15% of a noble gas.

31. The integrated circuit according to claim 30, wherein the thin film is a diamond film provided with a region including a composite defect (an NV center) of nitrogen (N) that has replaced a carbon atom and a vacancy (V) adjacent to the nitrogen.

32. The integrated circuit according to claim 30, wherein the noble gas is argon gas.

33. The integrated circuit according to claim 30, wherein the thin film is diamond including a composite defect (an NV center) of nitrogen (N) that has replaced a carbon atom and a vacancy (V) adjacent to the nitrogen, diamond including SiV, SnV, PbV, and GeV, or silicon carbide (SiC), gallium nitride (GaN), zinc oxide (ZnO), aluminum nitride (AlN), boron nitride (BN), or gallium oxide ($Ga_2O_3$) that has an atomic vacancy in a crystal thereof.

34. A sensor system provided with a plurality of the integrated circuits according to claim 20, wherein the plurality of the integrated circuits can be arranged in an array on a surface or in a depth direction of a measurement target.

35. A sensor system, comprising:
   an integrated circuit having a PIN diode formed of a wide band semiconductor that has a band gap of 2.2 eV or more, having a P-type semiconductor (P), an N-type semiconductor (N), and a thin film that is a semiconductor (I) provided between the P-type semiconductor and the N-type semiconductor and having a lower impurity concentration than those of the P-type semiconductor and the N-type semiconductor, and in which a crystal includes a composite defect of an impurity atom and a vacancy;
   a microwave generator configured to generate a microwave to irradiate the thin film;
   an excitation driver configured to drive to excite the thin film; and
   a detector configured to detect a change in conductivity of the thin film based on excitation when transitioning from an excited state to a ground state,
   wherein the integrated circuit includes a microwave irradiation system configured to irradiate the thin film with the microwave, an excitation unit configured to excite the thin film, and a circuit configured to detect, as an electric signal, the change in conductivity of the thin film based on excitation when transitioning from an excited state to a ground state.

36. The sensor system according to claim 35, comprising a plurality of the integrated circuits,
   wherein the plurality of the integrated circuits can be arranged in an array on a surface or in a depth direction of a measurement target.

* * * * *